(12) United States Patent
Yuzurihara et al.

(10) Patent No.: US 10,348,267 B2
(45) Date of Patent: Jul. 9, 2019

(54) IMPEDANCE MATCHING DEVICE

(71) Applicant: KYOSAN ELECTRIC MFG. CO., LTD., Yokohama-shi, Kanagawa (JP)

(72) Inventors: Itsuo Yuzurihara, Yokohama (JP); Satoshi Aikawa, Yokohama (JP); Sadao Mori, Yokohama (JP); Tadaharu Ohno, Yokohama (JP)

(73) Assignee: KYOSAN ELECTRIC MFG. CO., LTD., Yokohama-shi (JP)

(*) Notice: Subject to any disclaimer, the term of this patent is extended or adjusted under 35 U.S.C. 154(b) by 0 days.

(21) Appl. No.: 15/746,867

(22) PCT Filed: Feb. 15, 2016

(86) PCT No.: PCT/JP2016/054221
§ 371 (c)(1),
(2) Date: Jan. 23, 2018

(87) PCT Pub. No.: WO2017/110098
PCT Pub. Date: Jun. 29, 2017

(65) Prior Publication Data
US 2018/0248534 A1     Aug. 30, 2018

(30) Foreign Application Priority Data

Dec. 25, 2015   (JP) .................... 2015-254520

(51) Int. Cl.
*H03H 7/38*     (2006.01)
*H01F 21/08*    (2006.01)
(Continued)

(52) U.S. Cl.
CPC .............. *H03H 7/38* (2013.01); *H01F 21/08* (2013.01); *H01F 27/38* (2013.01); *H01F 29/14* (2013.01);
(Continued)

(58) Field of Classification Search
CPC .. H03H 7/38; H03H 7/40; H01F 21/08; H01F 27/38
(Continued)

(56) References Cited

U.S. PATENT DOCUMENTS 4,951,009 A   8/1990 Collins
4,977,374 A   12/1990 Kleiner
(Continued)

FOREIGN PATENT DOCUMENTS

CN   1495283 A   5/2004
CN   1694346 A   11/2005
(Continued)

OTHER PUBLICATIONS

International Search Report dated Mar. 29, 2016, issued in counterpart International Application No. PCT/JP2016/054221 (2 pages).
(Continued)

*Primary Examiner* — Stephen E. Jones
*Assistant Examiner* — Samuel S Outten
(74) *Attorney, Agent, or Firm* — Westerman, Hattori, Daniels & Adrian, LLP

(57) ABSTRACT

An impedance matching device comprising a variable reactor having a main winding and control winding, wherein a generated magnet field in the core is an AC magnetic field with a magnitude exceeding a value to settle a deviation between a control target value for impedance matching and a feedback value, by changing the magnitude of the generated magnetic field by changing a control current passing through the control winding, thereby controlling inductance of the variable rector to be a predetermined value to perform impedance matching, the response delay in the impedance matching is reduced by reducing a response delay in the inductance variation of the variable reactor.

7 Claims, 15 Drawing Sheets

(51) Int. Cl.
    *H01F 27/38*    (2006.01)
    *H03H 7/40*     (2006.01)
    *H03H 11/40*    (2006.01)
    *H01F 29/14*    (2006.01)
    *H03H 1/00*     (2006.01)

(52) U.S. Cl.
    CPC .............. *H03H 7/40* (2013.01); *H03H 11/40* (2013.01); *H01F 2029/143* (2013.01); *H03H 1/00* (2013.01); *H03H 2001/0057* (2013.01)

(58) Field of Classification Search
    USPC ........................................................ 333/32
    See application file for complete search history.

(56) References Cited

U.S. PATENT DOCUMENTS

| | | |
|---|---|---|
| 5,187,454 A | 2/1993 | Collins et al. |
| 5,424,691 A | 6/1995 | Sadinsky |
| 5,654,679 A | 8/1997 | Mavretic et al. |
| 6,211,749 B1 | 4/2001 | Yuzurihara et al. |
| 7,382,598 B2 | 6/2008 | Weger |
| 2004/0139916 A1 | 7/2004 | Yajima et al. |
| 2005/0013084 A1 | 1/2005 | Weger |
| 2010/0164645 A1 | 7/2010 | Kobayashi et al. |
| 2012/0286703 A1 | 11/2012 | Touchi |

FOREIGN PATENT DOCUMENTS

| | | |
|---|---|---|
| CN | 101093748 A | 12/2007 |
| JP | H0521526 A | 1/1993 |
| JP | 5-89997 A | 4/1993 |
| JP | 8-55733 A | 2/1996 |
| JP | 2000-165175 A | 6/2000 |
| JP | 2004-104493 A | 4/2004 |
| JP | 2005-39266 A | 2/2005 |
| JP | 2010-537453 A | 12/2010 |
| JP | 2012-234769 A | 11/2012 |
| KR | 2000-0016599 A | 3/2000 |
| WO | 2015125416 A1 | 8/2015 |

OTHER PUBLICATIONS

Written Opinion of the International Searching Authority dated Mar. 29, 2016, issued in counterpart International Application No. PCT/JP2016/054221 (8 pages, including Japanese original and English translation).

Decision of Grant a Patent dated May 31, 2016, issued in counterpart Japanese application No. 2015-254520, with English translation (6 pages).

Search Report dated May 16, 2017, issued in Taiwanese application No. 105133078 (1 page).

Office Action dated Apr. 16, 2018, issued in counterpart Chinese application No. 201680030875.3, with English translation. (14 pages).

Notification of Decision dated Apr. 27, 2018, issued in counterpart Korean application No. 10-2017-7034500, with English translation. (2 pages).

Extended (supplementary) European Search Report dated Nov. 19, 2018, issued in counterpart European Application No. 16878001.3. (10 pages).

REDUCTION OF
RESPONSE DELAY TIME

REDUCTION OF
RESIDUAL MAGNETIC FLUX

REDUCTION OF
RESIDUAL MAGNETIC FLUX

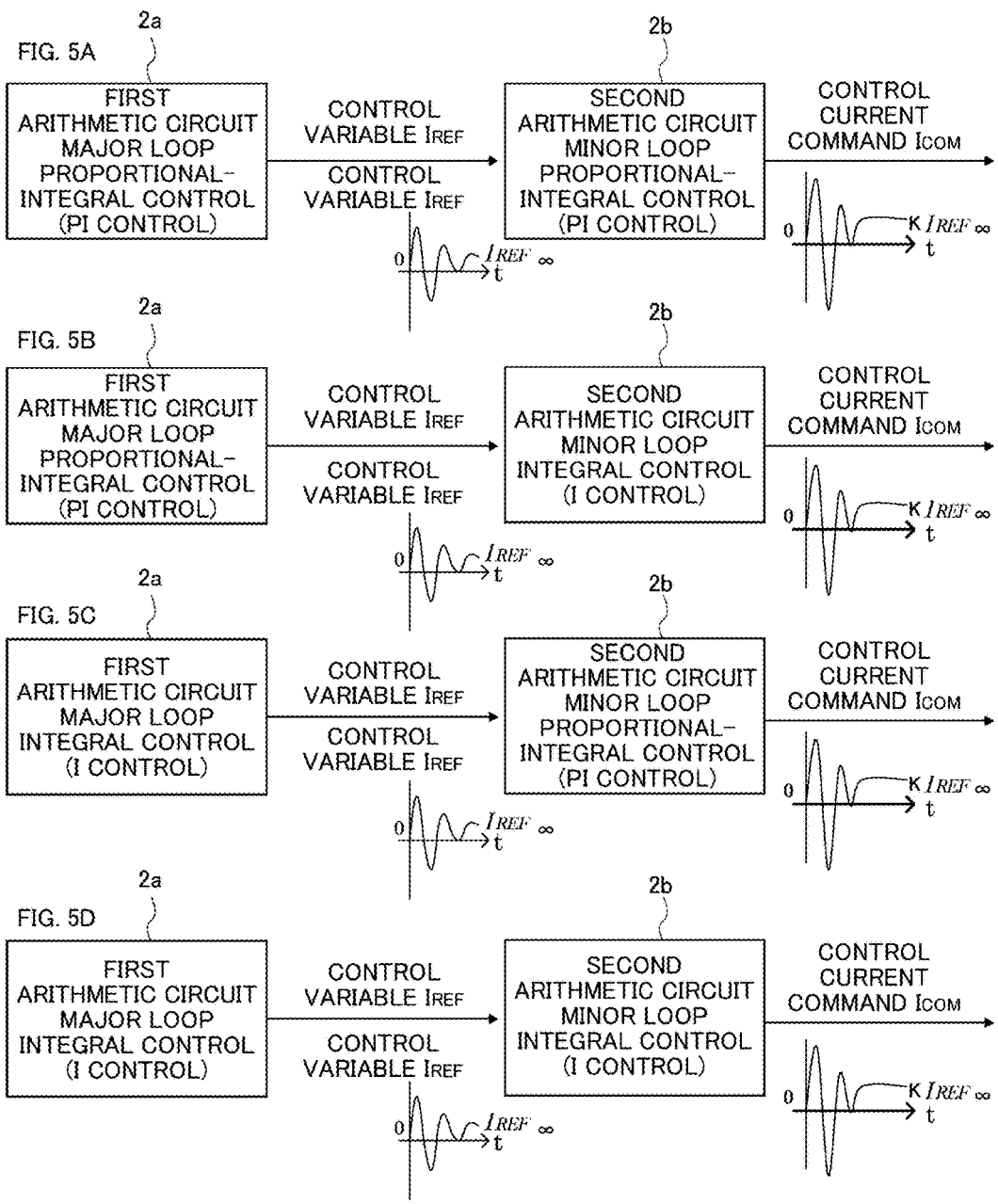

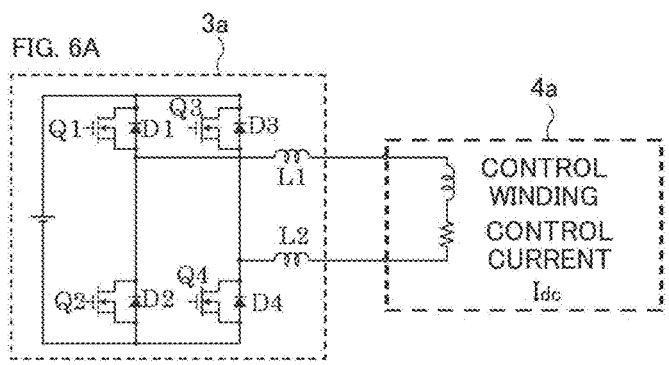
FIG. 6A
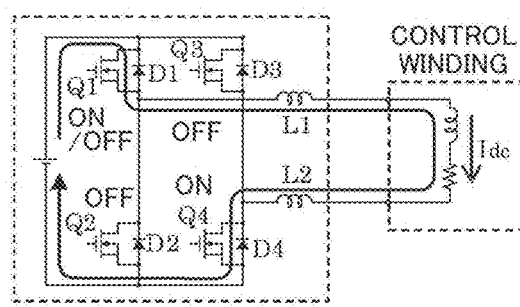
FIG. 6B
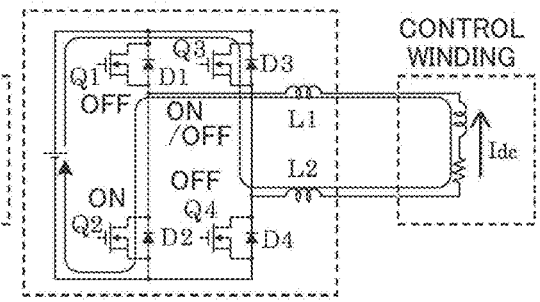
FIG. 6C OFFSET
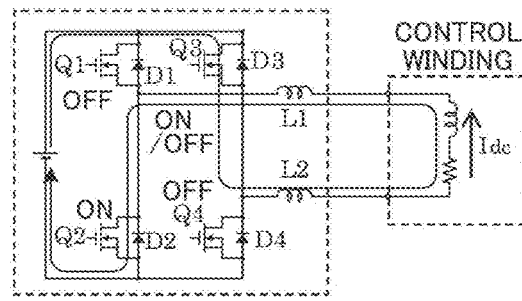
FIG. 6D
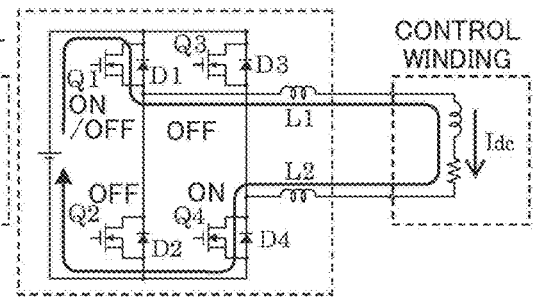
FIG. 6E OFFSET

CONTROL
VARIABLE $I_{REF}$

INPUT SIGNAL
TO Q4

INPUT SIGNAL
TO Q2

FIG. 15A DELAY IN RESPONSE TIME
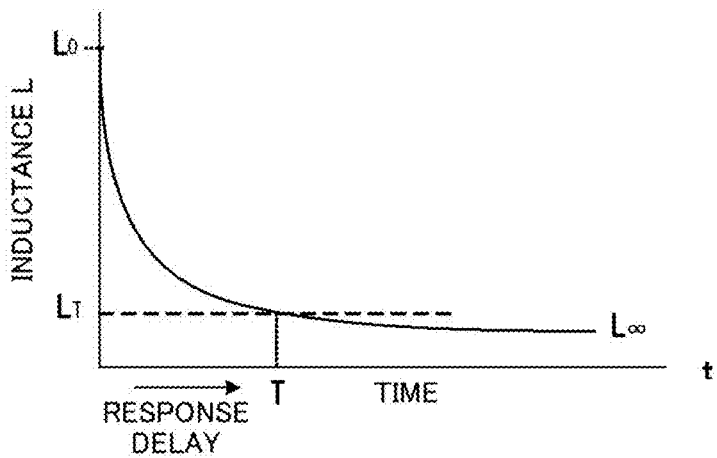
FIG. 15B INFLUENCE OF RESIDUAL MAGNETIC FLUX
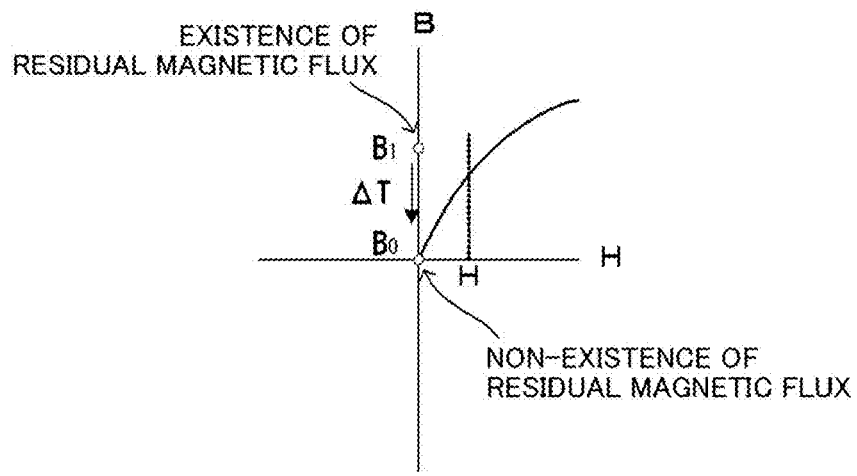
FIG. 15C INFLUENCE OF RESIDUAL MAGNETIC FLUX
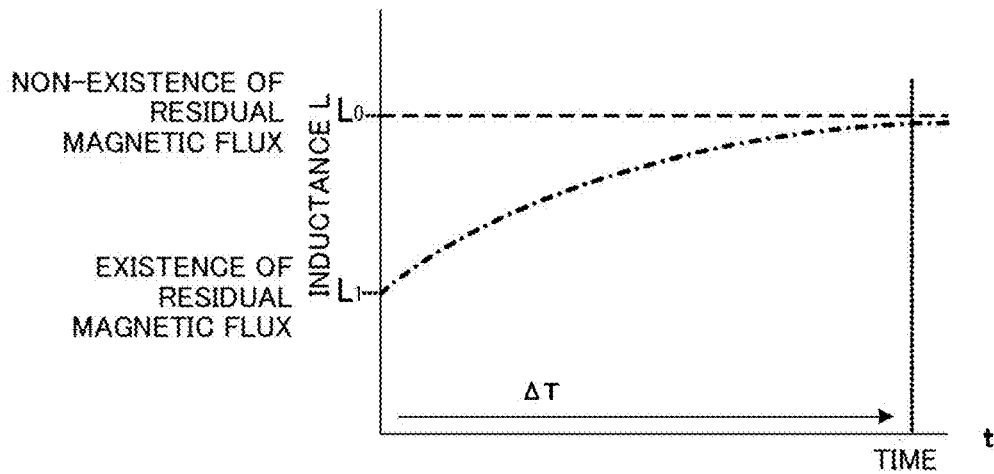

IMPEDANCE MATCHING DEVICE

TECHNICAL FIELD

The present invention relates to an impedance matching device for matching RF supply side impedance to load side impedance.

BACKGROUND ART

In supplying RF power to a load side, from an RF supply side such as an RF power source, an impedance matching device is provided for matching RF supply side impedance to load side impedance, thereby enhancing efficiency in supplying the RF power.

Along with producing a finer product by semiconductor producing equipment, a higher degree of stability against plasma load fluctuation is required, for example, prompt response and convergence within a short time, from exciting plasma until stabilization. In order to stabilize power feeding to plasma and to reduce plasma fluctuation, an impedance matching device is needed for enabling high-speed impedance matching.

Generally used impedance matching devices perform mechanical matching operations, by a motor-driven vacuum variable capacitor, and therefore, in some cases, several seconds may be required until completion of the impedance matching. Instead of such mechanical impedance matching devices, electronic impedance device not containing mechanical elements are also suggested. This kind of electronic impedance matching device is referred to as "electronic matcher" (see the patent document 1).

The electronic impedance matching device may be configured by a variable reactor. The variable reactor has a control winding together with a main winding, which are wound around a ferrite core, allowing the current in the control winding to be variable electronically according to a step-down chopper circuit so as to change inductance, and thereby rendering impedance to be variable. According to the variable reactor, the impedance can vary by controlling the current in the control winding, without using any mechanically movable part, providing advantages of speeding-up and maintenance-free.

FIGS. 14A through 14C each illustrates configuration example of the variable reactor that is used in a conventional electronic impedance matching device, FIG. 14A shows a circuit example of the variable reactor, and FIG. 14B shows an example of an EI core structure of the variable reactor.

The variable reactor 102 comprises two types of windings, a control winding 102a and main windings 102b (102b1 and 102b2), being wound around a ferrite core 102c. The control winding 102a is wound around a central part of the ferrite core 102c, and DC current passes therethrough. The main windings 102b are wound respectively around both sides of the ferrite core 102c, and they are fed with RF current, 13.56 MHz, for example, from a high-frequency power source (RF power source) that is connected to the impedance matching device.

The variable reactor 102 has wiring of the main windings being wound around both sides of the control winding as described above, and magnetic fields generated by the main winding 102b1 and the main winding 102b2 are canceled each other at the central part of the ferrite core 102c, thereby achieving a configuration that RF voltage generated by the main windings 102b1 and 102b2 is not induced into the control winding 102a side.

Here, inductance L of the variable reactor is determined according to the following formulas:

$$L = (\mu \cdot S / l) \cdot N^2 \qquad 1$$

$$\mu = B / H \qquad 2$$

In the formulas above, μ is magnetic permeability, S is core sectional area, N is the number of turns of the main winding, l is a magnetic path length, B is magnetic flux density, and H is a magnetic field. The formulas 1 and 2 represent that the inductance L is proportional to the magnetic permeability μ, and the magnetic permeability μ is inversely proportional to the magnetic field H.

The ferrite core used in the variable reactor has nonlinear hysteresis property, and the magnetic permeability μ is represented by a gradient on the B-H curve according to the formula 2.

The formulas 1 and 2 express that when the magnetic field H becomes smaller, the magnetic permeability μ becomes larger, and the inductance L also becomes larger. In addition, a magnitude of the magnetic field H generated in the ferrite core is proportional to DC current passing through the control winding. Therefore, in the electronic impedance matching device, the magnitude of the magnetic field H being generated is made to vary by controlling the DC current Idc passing through the control winding, and variation of the magnitude of the magnetic field H allows the inductance L of the variable reactor to be variable.

On the B-H curve, an AC magnetic field is generated by the RF current passing through the main windings, in addition to the DC magnetic field generated by the DC current passing through the control winding. However, in the variable reactor, when AC magnetic flux density is compared with DC magnetic flux density, in the range of the DC magnetic field generated by the DC current, the AC magnetic flux density is equal to or less than 10% of the DC magnetic flux density, and the magnetic flux density of the variable reactor can be considered as almost depending on the DC magnetic flux density. Therefore, it can be assumed that the magnetic permeability μ is determined by an operating point of the DC magnetic field and DC magnetic flux on the B-H curve. Thus, the inductance can be made variable, by controlling the DC control current to vary the magnetic field so that this variation of the magnetic field allows the magnetic permeability to be variable.

FIG. 14C illustrates a schematic configuration of the impedance matching device using the variable reactor. Here, the variable reactor 102A connected in parallel between input-output terminals varies the absolute value of the impedance, and the variable reactor 102B connected in series between the input-output terminals varies a phase component of the impedance. The impedance control circuit 101 varies the inductance of each variable reactor, thereby matching the impedance on the input terminal side to the impedance on the output terminal side.

PRIOR ART DOCUMENT

Patent Document

Patent Document 1
Japanese Unexamined Patent Application Publication No. 2000-165175

DISCLOSURE OF THE INVENTION

Problems to be Solved by the Invention

In the impedance matching device that performs impedance matching by varying the inductance according to the passage of controlling DC current through the control winding of the variable reactor, there is a time delay in inductance variation from applying the control current to the variable reactor until generating a predetermined inductance, and there is a problem that this delay in inductance variation exerts influence on responsiveness of the impedance matching.

The inventors of the present invention have found that following factors 1 and 2 cause the delay in inductance variation of the variable reactor. FIGS. 15A through 15C each illustrates the factors 1 and 2 that cause the response delay in inductance variation of the variable reactor.

FACTOR 1: It has been found that as one of the factors, there is a delay in inductance variation due to a delay property in inductance variation that is caused by applying the control current to the control winding.

When the control current is applied to the control winding, the inductance L of the control winding varies with the delay property. That inductance L can be considered as having the delay property with a primary delay time constant T as expressed by the formula 3, and this delay property causes a response delay in the inductance variation. The formula is as the following:

$$L(t) = (L_0 - L_\infty)e^{-\frac{1}{\tau}t} + L_\infty \quad (3)$$
$$\text{when } t = 0 \quad L(t = 0) = L_0$$
$$\text{when } t = \infty \quad L(t = \infty) = L_\infty$$

FIG. 15A illustrates the response delay caused by the delay property. In FIG. 15A, the inductance L(t) varies over time t, from $L_0$ toward $L_\infty$, with the time constant $\tau$. The inductance L(t) needs time T due to the delay property until reaching a predetermined value $L_T$ indicated by the broken line.

As one example, in the case where the control current is stepwise changed from 0 A to −10 A, the inductance L is expressed by the following formulas 4 and 5, respectively when t=τ and t=4τ, and $L_0$=500 nH and $L_\infty$=250 nH:

$$L(t=\tau)=0.368(L_0-L_\infty)+L_\infty=0.368\times250+250=342 \text{ nH} \quad 4$$

$$L(t=4\tau)=0.0183(L_0-L_\infty)+L_\infty=0.0183\times250+250=255 \text{ nH} \quad 5$$

As indicated by the aforementioned examples, because of the delay property, time is needed after applying the control current until reaching the inductance L determined by that control current.

FACTOR 2: As another factor, it has been found that there is a delay in the inductance variation due to a residual magnetic flux caused by hysteresis property of a ferrite core.

The ferrite core has a property of holding a magnetic flux even when the magnetic field is made to zero from magnetized state after applying the magnetic field, and yielding a residual magnetic flux, due to the hysteresis property. FIG. 15B illustrates the residual magnetic flux.

In the case where DC current applied to the control winding is made to zero, after applying the DC current to the control winding for establishing the magnetized state, the magnetic flux density B does not become $B_0$ due to the hysteresis property, even though the magnetic field is zero, and there is found the residual magnetic flux $B_1$. In the figure, the magnetic flux density B indicates zero at the point of $B_0$.

This residual magnetic flux $B_1$ decreases gradually with the passage of time, and after the elapsed time ΔT, it returns to the magnetic flux density $B_0$. During the period of the elapsed time ΔT until the residual magnetic flux $B_1$ returns to magnetic flux density $B_0$, the magnetic flux density B is a value that depends on the residual magnetic flux $B_1$. Therefore, when the magnetic field H is applied, which is smaller than the magnetic field corresponding to the residual magnetic flux $B_1$ on the B-H curve, the magnetic flux density B may not correspond to thus applied magnetic field H. Accordingly, in order to obtain a value of the inductance corresponding to the magnetic field H, which is obtained by applying the magnetic flux density B, it is necessary to wait for the elapsed time ΔT until the residual magnetic flux $B_1$ returns to the magnetic flux density $B_0$.

Accordingly, since the inductance L is proportional to the magnetic permeability μ determined by the magnetic flux density B and the magnetic field H on the B-H curve, a delay in varying the magnetic flux density B may cause a response delay in the inductance variation.

FIG. 15C illustrates the response delay in the inductance variation, which is caused by the residual magnetic flux. The inductance $L_1$ when there exists the residual magnetic flux $B_1$, varies with the passage of time, toward the inductance $L_0$ when the residual magnetic flux disappears. The alternate long and short dash line in FIG. 15C schematically indicates this variation. It should be noted that the variation being illustrated indicates a general tendency of time-based change, and it does not represent actual change. In addition, the time ΔT required from elimination of the residual magnetic flux $B_1$ until reaching the inductance $L_0$ depends on magnetic properties of the ferrite core.

Therefore, the impedance matching device has a problem that the response delay in the inductance variation of the variable reactor causes a response delay in impedance matching.

An object of the present invention is to solve the conventional problem as described above, aiming at reducing of the response delay in impedance matching, by reducing the response delay in the inductance variation of the variable reactor.

Means for Solving the Problems

The present invention is directed to an impedance matching device for matching RF supply side impedance to load side impedance, wherein impedance is changed by varying inductance of a variable reactor, and thereby performing impedance matching.

The variable reactor is provided with a main winding and a control winding, which are wound around a core. A magnetic field generated in the core of the variable reactor can be changed by varying control current that passes through the control winding. Since the inductance of the variable reactor varies according to the generated magnetic field, a current value of the control current passing through the control winding is made to vary to change a magnitude of thus generated magnetic field, and the inductance of the variable reactor is controlled to be a predetermined inductance, and accordingly, this allows the impedance matching to be performed.

i) In the impedance matching device of the present invention, the generated magnetic field applied to the variable reactor is made to be a magnitude exceeding a magnetic field that is required to settle a deviation between a control target value and a feedback value for impedance matching, and thereby reducing the response delay in the impedance matching, which is caused by the delay property in the inductance variation as indicated by the aforementioned factor 1.

In the present invention, by using a relationship between the aforementioned generated magnetic field H and the altered responsiveness in the inductance L, the generated magnetic field is expanded and accordingly, the altered responsiveness in the inductance is speeded up, whereby a delay in the inductance variation caused by the delay property in the inductance variation is reduced.

The generated magnetic field H obtained by applying the control current I is expressed by the formula 6:

$$H = N \cdot I / 1 \qquad 6,$$

where N is the number of turns of the control winding, and 1 is a magnetic path length.

The formula 6 indicates that the magnitude of the generated magnetic field H in the variable reactor is defined by the product N·I, where N is the number of turns N of the control winding, and I is a current value. Accordingly, by increasing either one of the number of turns of the control winding and the current value of the control current, or by increasing both of the number of turns of the control winding and the current value of the control current, the generated magnetic field in the variable reactor is expanded, thereby expediting reduction of the response delay in the inductance variation.

ii) In the impedance matching device of the present invention, the generated magnetic field in the variable reactor is rendered to be an AC magnetic field with amplitude oscillations between positive and negative polarities, thereby reducing the delay in inductance variation, which is caused by the residual magnetic flux according to the hysteresis property of the ferrite core, as indicated by the factor 2.

By applying the AC magnetic field as the magnetic field generated by the core, it is possible to move operating points on the B-H curve in the direction that reduces the residual magnetic flux. The AC magnetic field can reduce the residual magnetic flux quicker, compared to the reduction according to the change with passage of time without applying the magnetic field. Therefore, by applying the AC magnetic field, it is possible to shorten the time required until the residual magnetic flux disappears. This reduction of time required for disappearance of the residual magnetic flux, allows reduction of response delay in inductance variation of the variable reactor, and thereby reducing the responses delay in the impedance matching.

The impedance matching device of the present invention has a configuration for performing impedance matching by changing a magnitude of the inductance, according to a magnitude of the magnetic field of the generated magnetic field, comprising a variable reactor having a main winding and a control winding being wound around a core, the variable reactor rendering the inductance to be variable by changing the generated magnetic field according to the control current passing through the control winding, and a control current forming part for foaming the control current that is applied to the control winding.

The control current forming part is provided with an operation part configured to compute a deviation signal converging with a control settled value that settles a deviation component between a control target value and a feedback value for impedance matching, and a control current generator configured to generate control current having a current direction determined on the basis of positive and negative properties of an AC signal being a control variable in the operation part, and current amplitude determined on the basis of amplitude amplification of the AC signal. The control current is applied to the control winding of the variable reactor, varying the inductance of the variable reactor, whereby the impedance matching is performed.

It should be noted here that the control settled value is a control value stabilized after fluctuations according to a control action for controlling the deviation, and the control settled value in the operation part of the present invention is a value obtained by settling a deviation component according to a difference-based control.

The operation part computes a control variable that controls the deviation component between the control target value and the feedback value for impedance matching. The amplitude of the control variable oscillates between the positive and negative directions, and thereafter, it converges with the control settled value that settles the deviation component between the control target value and the feedback value for impedance matching. The control current generated by the control current generator changes current amplitude on the basis of the amplitude of the control variable, and the current direction is switched according to the polarities of the control variable.

According to the operations in the operation part, the amplitude of the AC signal is increased. The control settled value according to the AC signal with the increased amplitude becomes larger, relative to the control settled value without increasing the amplitude. In the control current generator, the AC signal with thus increased amplitude is used, expanding the amplitude of the control current, and thereby reducing the response delay in inductance variation of the variable reactor.

(Operation Part)

The operation part of the present invention comprises a first arithmetic circuit comprising a major loop for computing a control variable on the basis of a partial difference obtained by amplifying a difference between the control target value and the feedback value for impedance matching, and a second arithmetic circuit comprising a minor loop for outputting a control current command obtained by increasing amplitude of the control variable, on the basis of a difference between the control variable outputted from the first arithmetic circuit and a feedback value of the control current. The first arithmetic circuit and the second arithmetic circuit constitute a double loop control.

A first mode of the first arithmetic circuit may comprise a proportional integral (PI) control circuit configured to output as the control variable, a proportional-integral (PI) signal obtained by performing a proportional-integral (PI) control over a difference between the control target value and the feedback value for impedance matching. The proportional-integral control circuit configures settings of a transfer function parameter so that an output becomes an oscillating signal, thereby enabling the control variable to be an AC signal. Accordingly, the proportional-integral (PI) signal obtained through the operation of the proportional-integral control circuit, asymptotically converges to a control value of the proportional-integral (PI) control, with amplitude fluctuations in positive and negative directions. The proportional-integral control circuit may comprise an operational amplifier, and in this case, values of constitutional elements of the operational amplifier are set, so as to generate AC signals.

A second mode of the first arithmetic circuit may comprise an integral control circuit configured to output an integral signal as the control variable, by performing integral control over the difference between the control target value and the feedback value for impedance matching.

A first mode of the second arithmetic circuit may comprise a proportional-integral control circuit configured to output a proportional-integral (PI) signal as the control current command, by performing the proportional-integral (PI) control over a difference between the control variable of the first arithmetic circuit and a feedback value of the control current. A second mode of the second arithmetic circuit may comprise an integral control circuit configured to output an integral signal as the control current command, by performing integral control over the difference between the control variable of the first arithmetic circuit and the feedback value of the control current.

The operation part of the impedance matching device of this invention may comprise a combination of each mode of the first arithmetic circuit and the second arithmetic circuit, that is, following four configurations; a first configuration having the first mode of the first arithmetic circuit and the first mode of the second arithmetic circuit, a second configuration having the first mode of the first arithmetic circuit and the second mode of the second arithmetic circuit, a third configuration having the second mode of the first arithmetic circuit, and the first mode of the second arithmetic circuit, and a fourth configuration having the second mode of the first arithmetic circuit, and the second mode of the second arithmetic circuit.

The proportional-integral control circuit and the integral control circuit configure the settings of the transfer function parameter, so that the output becomes an oscillating signal, thereby enabling the control variable to be an AC signal. Accordingly, the proportional-integral signal obtained by the operation by the proportional-integral control circuit, asymptotically converges to a control value of the proportional-integral control, with amplitude fluctuations in positive and negative directions, and the integral signal obtained by the operation by the integral control circuit, asymptotically converges to a control value of the integral control, with amplitude fluctuations in positive and negative directions. Each of the proportional-integral control circuit and the integral circuit may comprise an operational amplifier, and in this case, values of constitutional elements of the operational amplifier can be set, so as to generate AC signals.

Amplitude amplification of the control variable may be performed in either one of the first arithmetic circuit and the second arithmetic circuit, or it may be performed in both the first arithmetic circuit and the second arithmetic circuit.

(Control Current Generator)

The control current generator of the present invention switches a current direction of the control current that is applied to the control winding, on the basis of the polarity of the control variable outputted from the arithmetic circuits, and controls the amplitude of the control current that is applied to the control winding, on the basis of the amplitude of the signals outputted from the arithmetic circuits.

The control current generator may comprise a chopper circuit of full-bridge configuration including four switching elements.

The chopper circuit includes four switching elements of the full-bridge configuration where two switching elements being connected to the positive end and another two switching elements being connected to the negative end, the two switching elements connected to one end, control the amplitude of the control current that is applied to the control winding, and the two switching elements connected to the other end control the direction of the control current that is applied to the control winding.

In controlling the amplitude of the control current that is applied to the control winding, a pulse width control is performed on the basis of the amplitude of the control current command, to open-close operations of either one of the switching elements, out of the two switching elements connected to the polarity on the positive end or the negative end, and the other switching element is turned off. A current value of the control current can be controlled according to a duty ratio of the open-close operations of the one switching element.

Switching of the current direction of the control current that is applied to the control winding is controlled, by switching alternately the two switching elements connected to the other polarities of the positive end and the negative end, according to the polarity of the control variable. The two switching elements are complementary each other between on an off, and alternate switching allows switching of the current direction.

Advantage of the Invention

As described so far, according to the president invention, reduction of the response delay in the inductance variation in the variable reactor allows reduction of response delay in impedance matching.

BRIEF DESCRIPTION OF THE DRAWINGS

FIGS. 5A through 5D each illustrates a configuration example of an operation part of the present invention;

FIGS. 6A through 6E each illustrates configurations and operations of a chopper circuit in a control current generator of the present invention;

FIGS. 15A through 15C each illustrates Factor 1 and Factor 2 that cause a response delay in inductance variation in the variable reactor.

BEST MODE FOR CARRYING OUT THE INVENTION

With reference to FIGS. 1 to 13I, an impedance matching device of the present invention will now be described.

Figure 1:
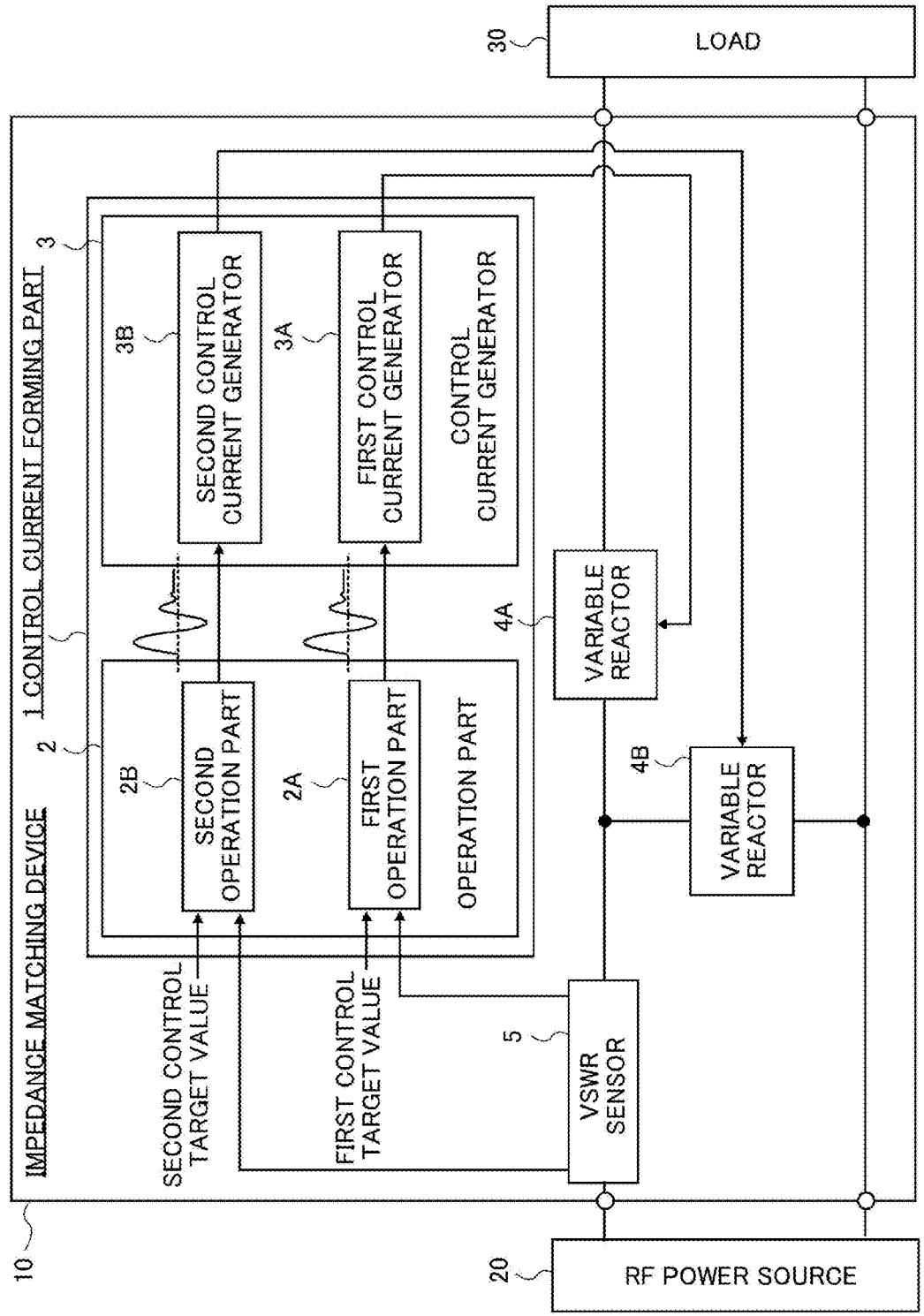
FIG. 1 illustrates a schematic configuration of an impedance matching device of the present invention.
Figure 8:
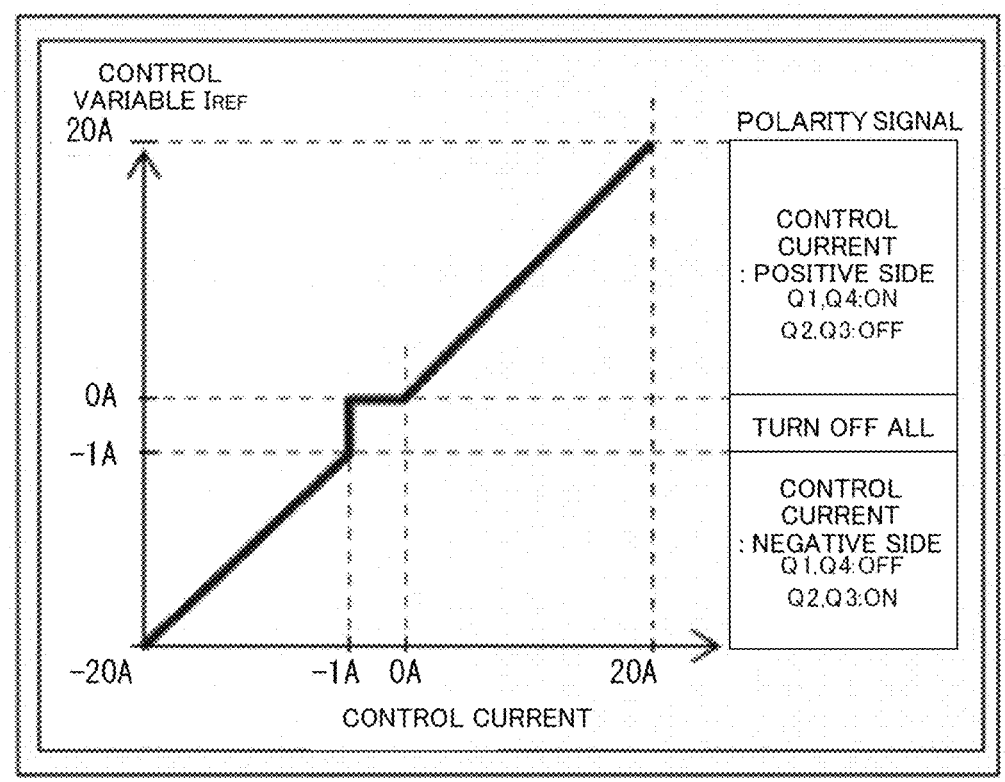
FIG. 8 illustrates one example of control current according to the present invention.
Figure 9:
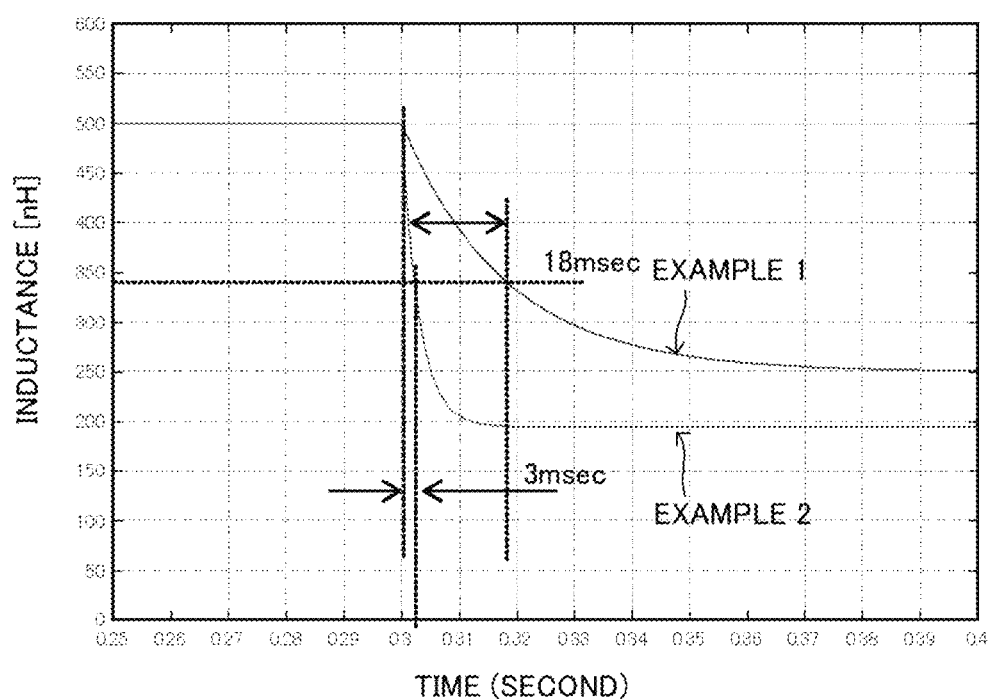
FIG. 9 illustrates implementation values of the first arithmetic circuit according to the present invention.
Figure 10B:
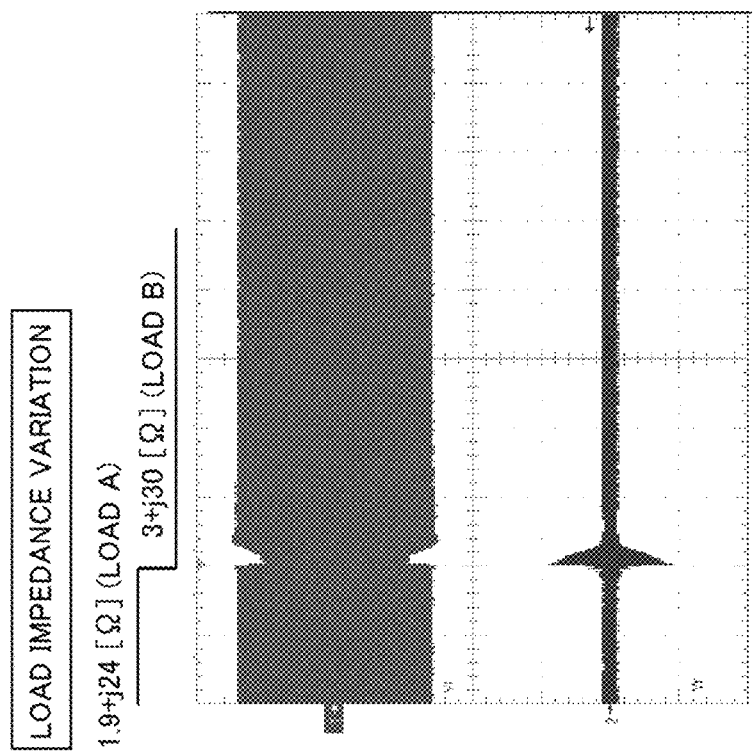
FIGS. 10A and 10B each illustrates one example of impedance matching according to the impedance matching device of the present invention.
Figure 10A:
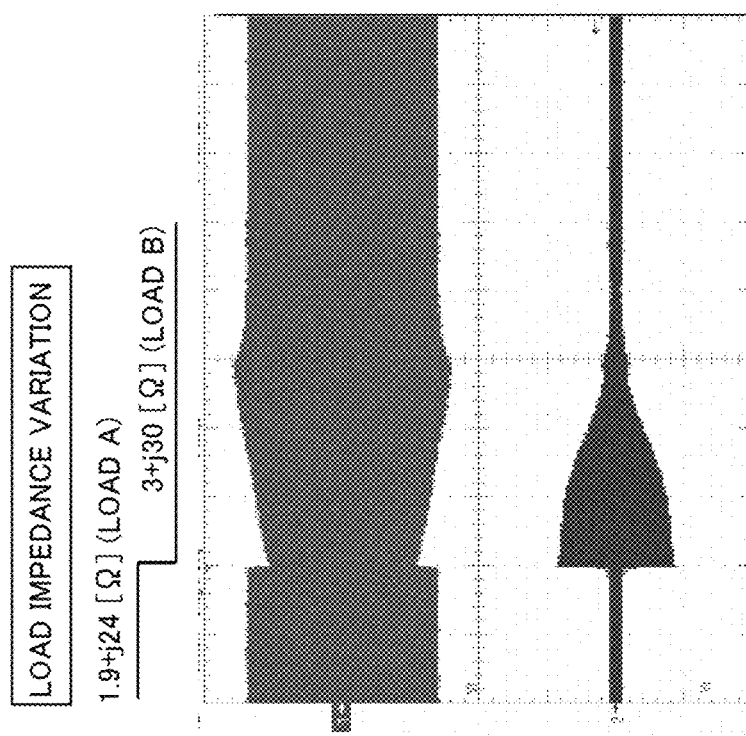

With reference to FIG. 1, a schematic configuration of the impedance matching device of the present invention will be described. With reference to FIGS. 2A through 2C, 3A, and 3B, operations of the present invention will be described. With reference to FIG. 4, a configuration example of a control current forming part according to the present invention will be described. With reference to FIGS. 5A through 5D, a configuration example of an operation part of the present invention will be described. With reference to FIGS. 6A through 6E, and 7, configurations and operations of a chopper circuit in the control current generator of the present invention will be described. With reference to FIG. 8, one example of the control current will be described. With reference to FIG. 9, implementation values of a first arithmetic circuit according to the present invention will be described. With reference to FIGS. 10A and 10B, one example of the impedance matching according to the impedance matching device of the present invention will be described. FIGS. 11A through 11C and 12A through 12C illustrate configurations of a variable reactor in the impedance matching device of the present invention, and FIGS. 13A through 13I each illustrates arrangements of the variable reactor of the present invention.

(Configuration of Impedance Matching Device of the Present Invention)

FIG. 1 illustrates a schematic configuration of the impedance matching device of the present invention. FIG. 1 shows an example of configuration where the impedance matching device 10 is connected between an RF power source 20 and a load 30. Following description will be provided, using an RF power source as a high frequency supply part.

The impedance matching device 10 performs impedance matching, for example, in such a manner that when impedance on the load 30 side varies, impedance viewed from the input side of the impedance matching device 10 matches to the impedance in the RF power source 20. In the case of impedance mismatch, reflected power is generated, returning from the impedance matching device 10 to the RF power source 20, and power supply efficiency to the load 30 is reduced. By matching the impedance between the RF power source 20 and the load 30, the reflected power is reduced, and accordingly, power supply efficiency from the RF power source 20 to the load 30 is improved.

By way of example, in the case where the load is a plasma load, such as semiconductor producing equipment and liquid crystal panel producing equipment, impedance is made to vary, not only at the time of plasma ignition, but also due to a device structure and installation condition, physical change including a temperature rise generated internally by high-frequency power applied to the load, chemical change of gas, and the like, generated within the load device.

As described above, when the impedance on the load side varies, impedance mismatch occurs between the RF power source and the load, and a part of the high-frequency power supplied from the RF power source is reflected and returns to the RF power source side, causing a problem that the power to be supplied to the load is reduced.

In the impedance matching device 10 of the present invention, a coupled circuit connecting the RF power source 20 with the load 30 is configured by using the variable reactor 4, allowing variation of inductance in the variable reactor 4 to cause variation of impedance, thereby matching the impedance in the RF power source 20 to the impedance in the load 30.

FIG. 1 illustrates an example of the impedance matching device using the coupled circuit where the variable reactor 4A and the variable reactor 4B are connected in series. The arrangement of the variable reactors is not limited to the example as shown in FIG. 1, and the arrangements as shown in FIGS. 13A through 13I, which will be described later, are also applicable.

Figure 14:
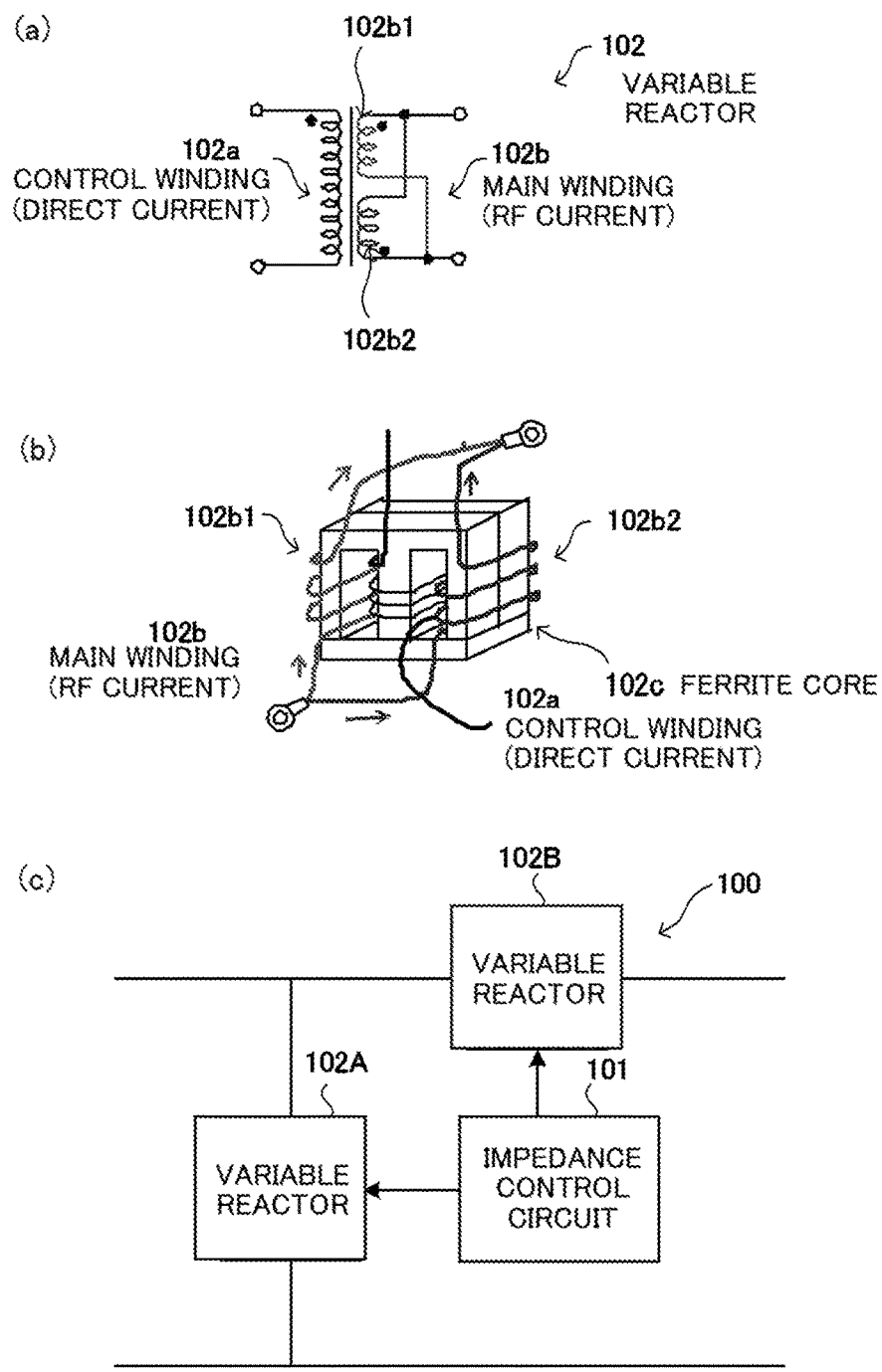
FIGS. 14A through 14C each illustrates a configuration example of a variable reactor that is used in a conventional electronic impedance matching device.

As shown in FIGS. 14A through 14C, each of the variable reactors 4A and 4B comprises a control winding through which the control current passes, and main windings through which RF current passes, and the control current passing through the control winding varies a magnetic field being generated, thereby rendering the inductance to be variable. In FIG. 1, in the variable reactor 4A connected in series, the inductance is made variable and thereby rendering phase $\varphi$ to be variable. In the variable reactor 4B connected in parallel, the inductance is made variable and thereby rendering impedance Z to be variable. It is to be noted that the impedance Z represents the absolute value of the impedance.

The impedance matching device 10 comprises a control current forming part 1 configured to form the control current to be applied to the control winding in the variable reactors 4A and 4B. The control current forming part 1 is provided with an operation part 2 and a control current generator 3.

The operation part 2 inputs a control target value and a feedback value for impedance matching, and calculates a control variable for settling a deviation component, which is based on the deviation component that is obtained by amplifying a difference between the control target value and the feedback value. The control variable of the operation part 2 is an AC signal converging to a control settled value that settles the deviation component obtained by amplifying the difference between the control target value and the feedback value for impedance matching, along with amplitude oscillations between positive and negative polarities. In here, the feedback value is a value indicating the impedance matching state, using the absolute value of the impedance or phase detection data as the feedback value, when viewed from the input side of the impedance matching device, and it can be represented by a voltage standing wave ratio (VSWR), for instance. In FIG. 1, the operation part 2 inputs the control target value from a controller, not illustrated, and also inputs the voltage standing wave ratio as the feedback value, which is detected by the VSWR (Voltage Standing Wave Ratio) sensor 5.

The control current generator 3 generates the control current that is applied to the control windings of the variable reactors 4A and 4B, on the basis of the control variable obtained by the computation in the operation part 2. The direction of the control current is switched in accordance with the positive and negative polarities of the control variable, and current amplitude of the control current is amplified on the basis of the amplitude of the control variable.

Each of the operation part 2 and the control current generator 3 is provided with two control systems; a control system for foaming the control current of the variable reactor 4A, and a control system for forming the control current of the variable reactor 4B.

The control system for foaming the control current of the variable reactor 4A as shown in FIG. 1, controls the phase $\varphi$ relating to the impedance matching, and it is provided with the first operation part 2A and the first control current generator 3A. The first operation part 2A inputs a phase control target value φREF, as the first control target value, and also inputs the phase feedback value φFB that is detected by the VSWR sensor 5. In this example here, the phase control target value is represented by the phase control target value φREF, and the phase feedback value is represented by the phase feedback value φFB.

The control system for foaming the control current in the variable reactor 4B as shown in FIG. 1, controls the absolute value of the impedance, and the control system is provided with a second operation part 2B and a second control current generator 3B. The second operation part 2B inputs as the second control target value, the control target value ZREF being the absolute value of the impedance, and inputs the feedback value ZFB being the absolute value of the impedance detected by the VSWR sensor 5. In the example here, the control target value being the absolute value of the impedance is represented by the impedance control target value ZREF, and the feedback value being the absolute value of the impedance is represented by the impedance feedback value ZFB.

On the basis of the voltage standing wave ratio that is obtained when the VSWR sensor 5 detects a state of impedance matching between the RF power source 20 and the load 30, the voltage impedance matching device 10 obtains the phase feedback value φFB and the feedback value ZFB of the impedance, inputs those feedback values into the operation part 2, together with the control target values, and computes the control variable IREF. Then, the control current generator 3 generates control current to be applied to the control winding of the variable reactor 4 on the basis of the control variable IREF. The variable reactor 4 varies inductance according to the control current, thereby varying the impedance, and impedance matching is performed.

The first operation part 2A computes a phase control variable IφTREF, from the phase control target value TREF and the phase feedback value φFB. The first control current generator 3A generates the control current to be applied to the control winding of the variable reactor 4A, on the basis of the phase-control variable IφTREF. The variable reactor 4A adjusts the phase according to the inductance variation on the basis of the control current.

The second operation part 2B computes the control variable IREF from the impedance control target value ZREF and the impedance feedback value ZFB. The second control current generator 3B generates the control current to be applied to the control winding of the variable reactor 4B on the basis of the control variable IREF. The variable reactor 4B adjusts the absolute value of the impedance according to the inductance variation on the basis of the control current.

The impedance matching device of the present invention configures the control variable generated in the operation part 2 as an AC signal, thereby reducing a response delay in inductance variation, which occurs due to a delay property of the variable reactor; and amplifies amplitude of the control current generated in the control current generator 3 to a magnitude exceeding the amplitude of the control value required in the control system, thereby reducing the response delay in inductance variation, which occurs due to a residual magnetic flux in the variable reactor.

(Operations of the Impedance Matching Device)

Figure 2A:
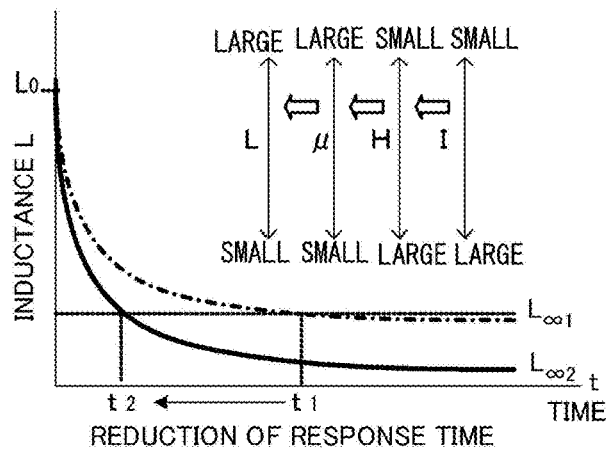
FIGS. 2A through 2C each illustrates operations of the impedance matching device of the present invention.
Figure 2B:
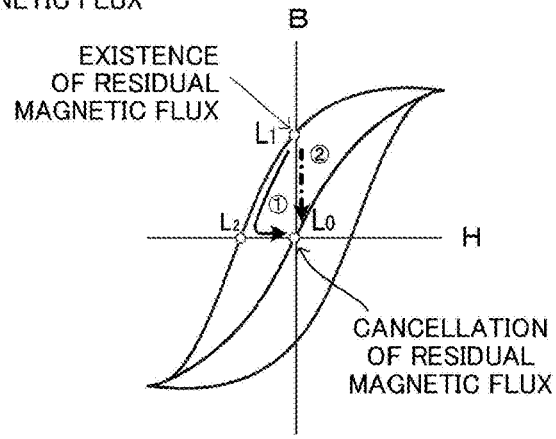
Figure 2C:
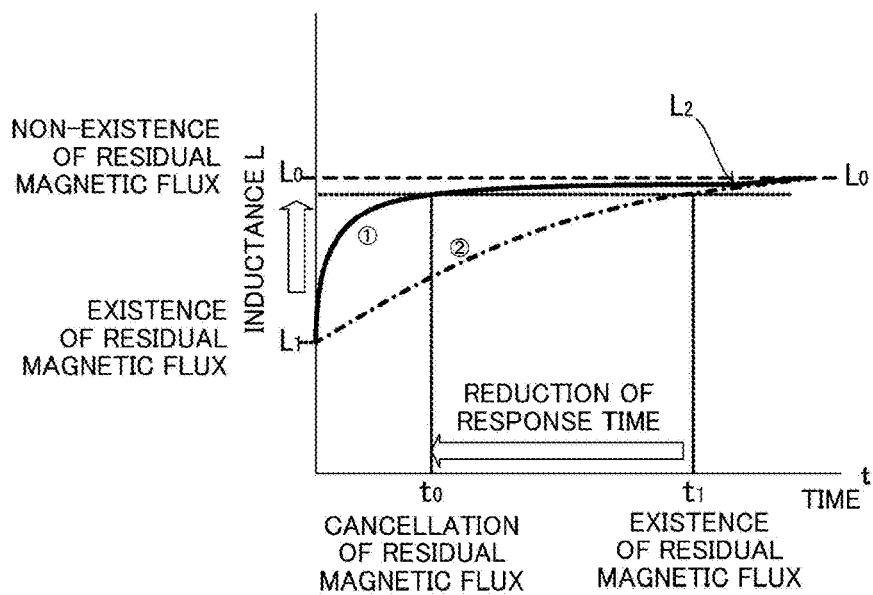

Next, with reference to FIGS. 2A through 2C, 3A, and 3B, operations in the impedance matching device of the present invention will be described, for reducing the response delay in inductance variation in the variable reactor. FIGS. 2A through 2C each illustrates reduction of the response delay time, and FIGS. 3A and 3B each describes the operations for reducing the response delay time in the inductance variation according to the control variable of the present invention.

Operations for Reducing Response Delay Time Caused by Delay Property:

FIG. 2A is a schematic view illustrating a relationship between control current and generated magnetic field in the control winding, and a response time in inductance variation.

The aforementioned formulas 1 and 2 express the relationship among the inductance L, generated magnetic field H, and magnetic permeability μ in the variable reactor, and the control current I in the control winding. The inductance L is proportional to the magnetic permeability μ, the magnetic permeability μ is inversely proportional to the magnetic field H, and the inductance L is inversely proportional to the magnetic field H and the control current I.

In addition, as expressed by the formula 3, since the inductance L can be assumed as a delay property having a primary delay time constant τ, and therefore, as the control current is made larger, a value of the inductance $L_\infty$ becomes smaller, and thus the response time required until reaching a predetermined inductance value becomes shorter. It is to be noted that the inductance $L_\infty$ represents an inductance value at a settled time when a sufficient amount of time has elapsed after the control current is applied.

FIG. 2A illustrates a relationship between the inductance $L_\infty$ at a settled time and the response time t of the inductance variation. The inductance $L_\infty$ at a settled time becomes smaller, as the generated magnetic field H becomes larger. The inductance $L_{\infty 2}$ at a settled time indicates that the generated magnetic field H is larger relative to the case of the inductance $L_{\infty 1}$ at a settled time.

In this inductance variation, when comparing the time until reaching a predetermined magnitude of the inductance L as indicated by the broken line, the time is $t_1$ in the case of the inductance $L_{\infty 1}$ at a settled time, and on the other hand, the time is $t_2$ ($<t_1$) in the case of the inductance $L_{\infty 2}$ ($<L_{\infty 1}$) at a settled time, where the time $t_2$ is shorter than the time $t_1$.

Therefore, the larger is the generated magnetic field H in the variable reactor, the response time in the inductance variation can be made shorter. It is to be noted that since the generated magnetic field H is proportional to the control current I and the number of turns N of the control winding, as expressed by the formula 6, the response time of the inductance variation can be reduced, by increasing the control current I and/or the number of turns N.

Operations for Reducing Response Delay Time Caused by Residual Magnetic Flux:

FIGS. 2B and 2C illustrate a reduction of the residual magnetic flux.

A ferrite core used in the variable reactor has a non-linear hysteresis property, and there exists the residual magnetic flux after the magnetic field disappears. FIG. 2B shows the hysteresis property, and FIG. 2C shows the state how the residual magnetic flux is reduced.

In the hysteresis property as shown in 2B, $L_1$ represents the inductance caused by the residual magnetic flux on the B-H curve. The residual magnetic flux is gradually reduced with the passage of time, in the direction where the magnetic flux density B becomes 0 (reference number 2 in the figure), and the inductance is changed from $L_1$ to the inductance $L_0$. The inductance when the residual magnetic flux disappears is represented by $L_0$. The dot-and-dash line in FIG. 2C (reference number 2 in the figure) indicates the state that the residual magnetic flux is reduced with the passage of time.

On the other hand, when the magnetic field in the negative direction is applied to the ferrite core, the residual magnetic flux varies in the direction (reference number 1 in the figure) where the magnetic flux density B becomes 0 along the B-H curve, and after the magnetic field is cancelled, both the magnetic flux density B and the magnetic field H move to the transfer point 0, reaching the inductance $L_0$ defined by the B-H curve. The solid line in FIG. 2C (reference number 1 in the figure) indicates the state how the residual magnetic flux is reduced in the negative direction.

When the time until reaching the predetermined inductance (the inductance indicated by the fine broken line in FIG. 2C is compared, the elapsed time required to reach the predetermined inductance without applying the magnetic field is $t_1$, and the elapsed time required to reach the predetermined inductance with applying the magnetic field in the negative direction is $t_2$ ($<t_1$).

Therefore, by applying the negative-direction magnetic field of the variable reactor, the response time of the inductance variation can be reduced. In this example, the negative-direction magnetic field is applied, but depending on the position on the B-H curve where the operating point of the residual magnetic flux exists, application of the magnetic field in the positive direction may reduce the residual magnetic flux, and thereby reducing the response time in the inductance variation.

(Reduction of Response Delay Time According to AC Magnetic Field)

The impedance matching device of the present invention applies an AC magnetic field, and sets the AC magnetic field to have a magnitude that exceeds a generated magnetic field for controlling a deviation between an impedance target value and an impedance detected value on the input side of the impedance matching device. With variation of the inductance by using the AC magnetic field, the response delay time caused by the aforementioned delay property is reduced, and the response delay time caused by the residual magnetic flux is also reduced.

Figure 3A:
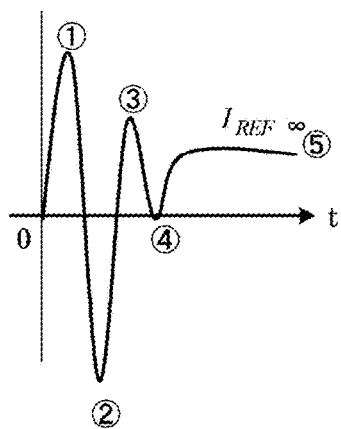
FIGS. 3A and 3B each illustrates operations of the impedance matching device of the present invention.
Figure 3B:
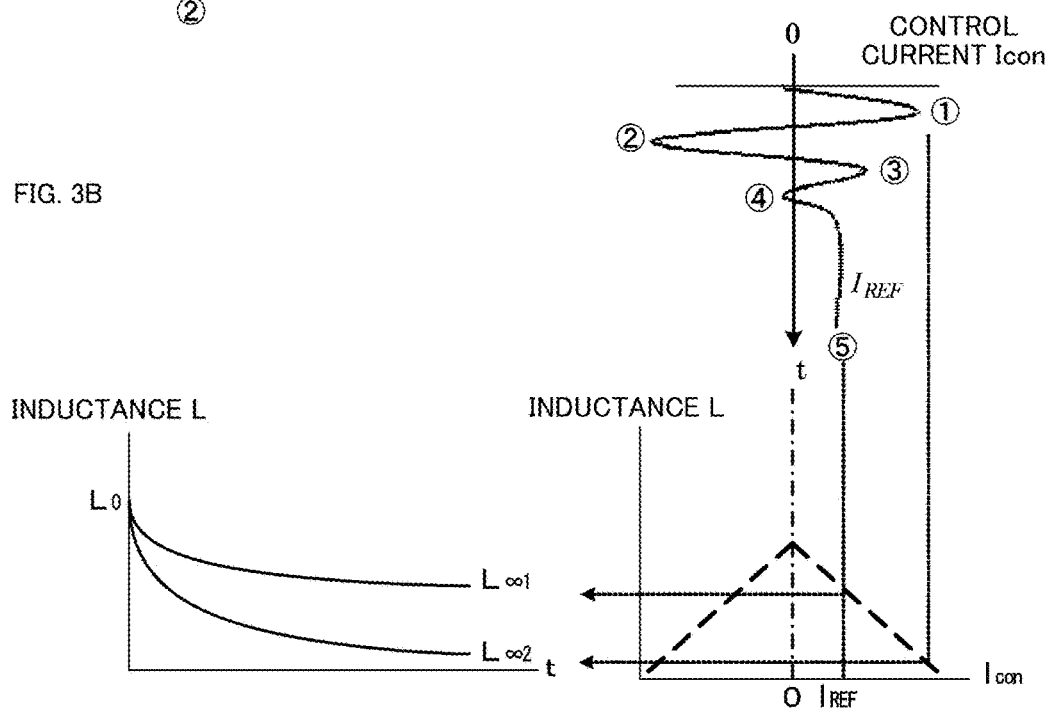
Figure 4:
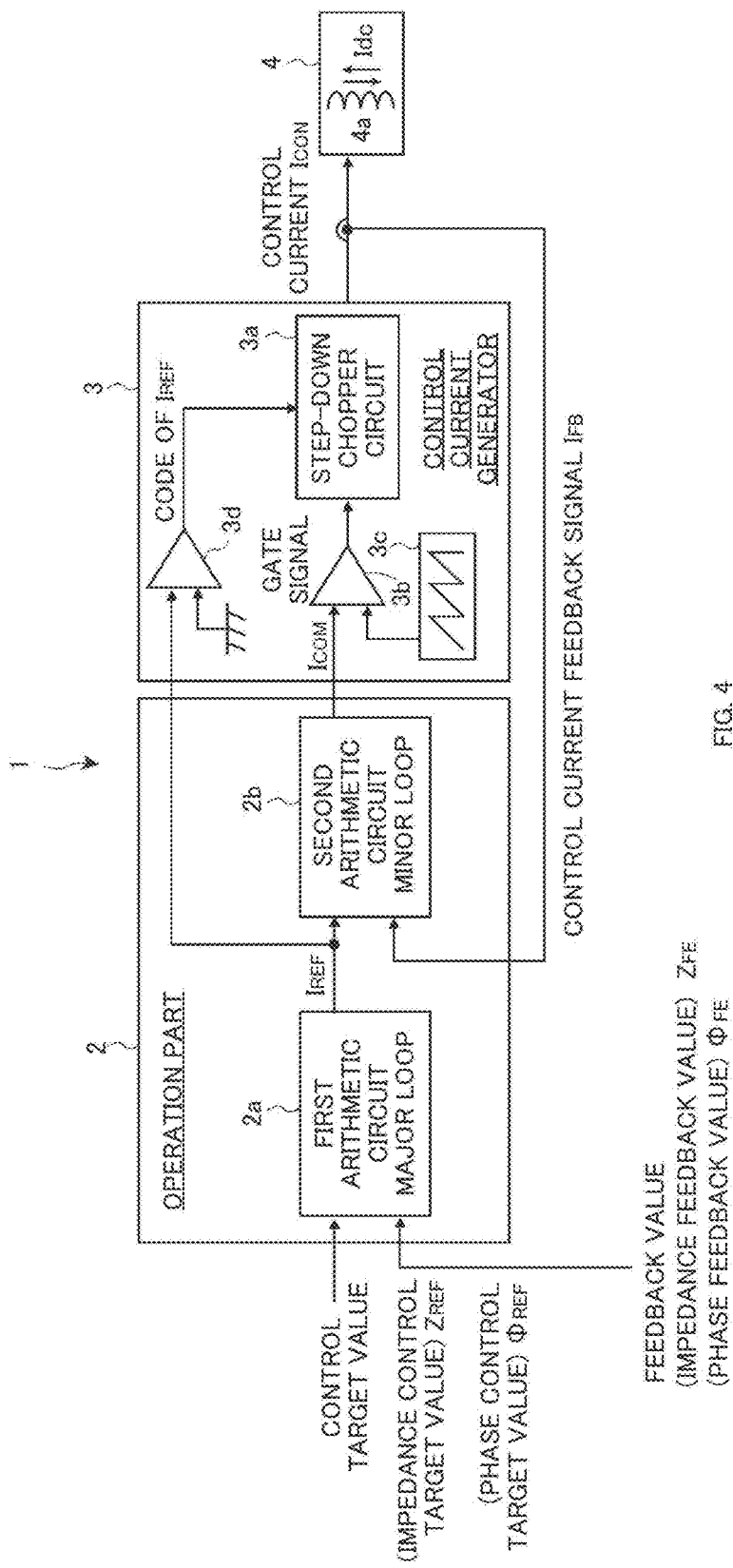
FIG. 4 illustrates a configuration example of a control current forming part of the present invention.

FIGS. 3A and 3B each illustrates reduction of the response delay time according to the AC magnetic field. FIG. 3A schematically illustrates a control variable IREF signal. As described above, the control variable IREF is a control variable which controls the deviation between the impedance target value and the impedance-detected value on the input-side of the impedance matching device. The control variable IREF used in the impedance matching device of the present invention is an AC signal converging to a control settled value $IREF_\infty$ that controls the deviation between the impedance target value and the impedance detection value on the input side of the impedance matching device, along with amplitude oscillations between positive and negative polarities.

In FIG. 3A, the control variable IREF converges to the control settled value $IREF_\infty$, along with oscillations between both positive and negative polarities. Circled numbers 1 to 4 in the figure indicate peaks of the AC signal, and the circled number 5 indicates the control settled value $IREF_\infty$, It is to be noted that the waveform of this AC signal is just an example and the waveform is not limited to this example. Reduction of Response Delay Time Caused by Delay Property:

FIG. 3B illustrates the state of inductance variation when the control current Icon is applied. The control current Icon is current to be applied to the control winding of the variable reactor, and it is obtained on the basis of the control variable IREF. In FIG. 3B, the circled numbers 1 to 5 provided on the control current Icon respectively correspond to the circled numbers of the control variables in FIG. 3A.

The control current Icon is alternate current, similar to the control variable IREF, and it is AC current converging to a current value corresponding to the control settled value $IREF_\infty$, along with amplitude oscillations between positive and negative polarities.

By applying the current value indicated by the circled number 1 of the control Icon, the inductance L of the variable reactor varies toward the inductance $L_{\infty 2}$ settled by this current value. The inductance $L_{\infty 2}$ at the settling time becomes smaller than the inductance $L_{\infty 1}$ that is settled by the control current in association with the control variable IREF that is obtained without signal amplification. With this configuration, similar to the inductance variation as shown in FIG. 2A, the response time in the inductance variation is reduced.

(Control Current Forming Part of the Present Invention)

With reference to FIGS. 4 and 5A through 5D, a configuration example of the control current forming part will be described. The control current forming part 1 of the present invention is provided with the operation part 2 and the control current generator 3. The operation part 2 computes a control variable IREF and a control current command Icom, and the control current generator 3 generates the control current Icon on the basis of the operation results from the operation part 2 and applies the control current to the control winding 4a in the variable reactor 4. The variable reactor 4 performs impedance matching, by varying inductance of the control winding 4a according to the control current Icon.

The operation part 2 is configured by a series connection between the first arithmetic circuit 2a and the second arithmetic circuit 2b. In the operation for reducing the response time in the inductance variation of the present invention, the first arithmetic circuit 2a reduces the response delay time caused by the residual magnetic flux in the variable reactor, and the response delay time caused by the inductance delay property of the variable reactor.

The first arithmetic circuit 2a inputs a control target value being a control target for impedance matching, and a feedback value detected from an object of the impedance matching, and computes control variable IREF that settles a deviation component between the control target value and the feedback signal, so as to cancel the difference. The control variable IREF computed by the first arithmetic circuit 2a is an AC signal that approaches and converges to the control settled value $IREF_\infty$, being a settled value by the operation, along with the amplitude oscillations between both polarities positive and negative.

The second arithmetic circuit 2b inputs the control variable IREF, being the output signal from the first arithmetic circuit 2a, together with a control current feedback signal $I_{FB}$, and then computes a difference between those inputted signals is calculated, so as to output a signal of the control current command Icom for settling the difference. The second arithmetic circuit 2b configures a minor loop, and the first arithmetic circuit 2a configures a major loop of the impedance matching. The response speed of the minor loop is higher than the response speed of the major loop, and the minor loop responds at around six times higher speed than the major loop, for instance. According to this double loop control by the minor loop and the major loop, while repeating an operation in the minor loop for controlling the control current command Icom to be an output in accordance with the control variable IREF, an operation in the major loop is performed so as to control the feedback values ($Z_{FE}$, $\varphi_{FE}$) to be associated with a value according to the control target values ($Z_{REF}$, $I_{REF}$) for the impedance matching.

The operation part 2 outputs amplified AC signals. The amplification of the AC signals is performed in the second arithmetic circuit 2b. Alternatively, it may be performed in the first arithmetic circuit 2a, or in both arithmetic circuits; the first arithmetic circuit 2a and the second arithmetic circuit 2b.

In generating the control current Icon according to the control current generator 3, amplitude of the control current Icon is controlled on the basis of the control current command Icom from the operation part 2. Since the control current command Icom is amplified in the operation part 2, the control current Icon that is famed on the basis of the control current command Icom may exceed a rated value of stationary current. However, since the control variable IREF and the control current command Icom outputted from the operation part of the present invention are AC signals, the amplitude asymptotically approaches the control settled variable, within a short time period that may not destroy elements, and therefore, destruction of elements due to excessive stationary current can be avoided.

In order to avoid element destruction due to instantaneous current, an upper limit may be provided to a gain or amplitude of the control variable IREF of the first arithmetic circuit 2a, or to a gain or amplitude of the control current command Icom of the second arithmetic circuit 2b.

Control of the major loop according to the first arithmetic circuit 2a may be performed by proportional integral control (PI control) or integral control (I control). In addition, also the control of the minor loop according to the second arithmetic circuit 2b may be performed by the proportional integral control (PI control) or the integral control (I control). Therefore, the first arithmetic circuit 2a and the second arithmetic circuit 2b can be configured in four ways of combination; each being performed by the proportional integral control or the integral control. With reference to FIGS. 5A through 5D, the first to the fourth configuration examples for controlling the major loop and the minor loop will be described.

First Configuration Example:

The first configuration example as shown in FIG. 5A illustrates an example that the major loop in the first arithmetic circuit 2a is subjected to the proportional integral control (PI control), and the minor loop in the second arithmetic circuit 2b is subjected to the proportional integral control (PI control).

The first arithmetic circuit 2a is configured by the proportional-integral control circuit (PI control circuit), and values of the operational elements are set to be values that increase the amplitude, along with output amplitude oscillations. In this configuration example, the proportional integral control (PI control) is performed so as to amplify the control variable and to convert the control variable to an AC signal.

The minor loop in the second arithmetic circuit 2b performs signal amplification by the proportional integral control (PI control), and outputs the control variable IREF of the first arithmetic circuit 2a in the form of the control current command Icom.

Second Configuration Example

The second configuration example as shown in FIG. 5B illustrates that the major loop in the first arithmetic circuit 2a is performed by the proportional integral control (PI control), and the minor loop in the second arithmetic circuit 2b is performed by the integral control (I control).

The first arithmetic circuit 2a is configured by the proportional-integral control circuit (PI control circuit), and values of the operational elements are set to be values that increase the amplitude, along with the amplitude oscillations. In this configuration example, by performing the proportional integral control (PI control), the control variable is amplified and converted to an AC signal.

The minor loop of the second arithmetic circuit 2b performs signal amplification according to the integral control (I control), and the control variable IREF of the first arithmetic circuit 2a is outputted in the foam of the control current command Icom.

Third Configuration Example:

The third configuration example as shown in FIG. 5C illustrates that the major loop of the first arithmetic circuit 2a is performed by the integral control (I control), and the minor loop of the second arithmetic circuit 2b is performed by the proportional integral control (PI control).

The first arithmetic circuit 2a is configured by the integral control circuit (I control circuit), and values of the operational elements are set to be values that increase the amplitude, along with output amplitude oscillations. In this configuration example, by performing the integral control (I control), the control variable is amplified and converted to an AC signal.

The minor loop of the second arithmetic circuit 2b performs signal amplification according to the proportional integral control (PI control), and the control variable IREF of the first arithmetic circuit 2a is outputted in the foam of control current command Icom.

Fourth Configuration Example:

The fourth configuration example as shown in FIG. 5D illustrates that the major loop of the first arithmetic circuit 2a is performed by the integral control (I control), and the minor loop of the second arithmetic circuit 2b is performed by the integral control (I control).

The first arithmetic circuit 2a is configured by the integral control circuit (I control circuit), and values of the operational elements are set to be values that increase the amplitude, along with the output amplitude oscillations. In this configuration example, by performing the integral control (I control), the control variable is amplified and converted to an AC signal.

The minor loop of the second arithmetic circuit 2b performs signal amplification according to the integral control (I control), and the control variable IREF of the first arithmetic circuit 2a is outputted in the foam of the control current command Icom.

(Control Current Generator of the Present Invention)

The control current generator 3 is provided with a step-down chopper circuit 3a, a comparison circuit 3b, a triangle wave signal generation circuit 3c, and a comparison circuit 3d.

The comparison circuit 3b inputs the control current command Icom from the operation part 2 as a gate signal, which is compared with a triangle wave generated in the triangle wave signal generation circuit 3c, and then, outputs a duty pulse signal. The step-down chopper circuit 3a performs open and close control of DC voltage using the duty pulse signal, thereby forming the control current. The step-down chopper circuit 3a may be a circuit of a full-bridge configuration comprising four switching elements, for instance.

The step-down chopper circuit 3a switches the current direction of the control current Icon, on the basis of the polarity of the control variable IREF, positive or negative, and switches the directions of the control current Icon passing through the control winding 4a in the variable reactor 4. The comparison circuit 3d is a circuit for outputting a code signal, positive or negative, of the control variable IREF. By way of example, it may be a circuit having a configuration to compare between the control variable IREF and the ground voltage. The step-down chopper circuit 3a switches the current direction of the control current Icon on the basis of an output from the comparison circuit 3d. The configuration for forming the code signal is not limited to the comparison circuit 3d, but it may be provided on the operation part 2 side.

(Operation Example of the Step-down Chopper Circuit)

With reference to FIGS. 6A through 6E, 7, and 8, an operation example of the step-down chopper circuit 3a will be described. FIGS. 6A through 6E each illustrates the operation example where the step-down chopper circuit 3a includes a full-bridge comprising four switching elements, FIGS. 7A through 7C each illustrates an example of input signals for driving the switching elements, and FIG. 8 illustrates a dead band of the control current for avoiding a short-circuit in the step-down chopper circuit.

FIG. 6A illustrates a configuration example of the step-down chopper circuit 3a, showing a full-bridge configuration comprising four switching elements Q1 to Q4. One end of each of the switching elements Q1 and Q3 is connected to the positive terminal side of the DC power source, one end of each of the switching elements Q2 and Q4 is connected to the negative terminal side of the DC power source, the other end of the switching element Q1 is connected to the other end of the switching element Q2, and the other end of the switching element Q3 is connected to the other end of the switching element Q4. In addition, the control winding 4a is connected between the other end of the switching element Q1 and the other end of the switching element Q4.

In FIG. 6A, inductance L1 and inductance L2 are connected between the other end of the switching element Q1 and one end of the control winding 4a, and between the other end of the switching element Q4 and the other end of the control winding 4a, thereby establishing the step-down chopper circuit under constant-current control. However, the inductance is not limited to the configuration that is connected to both ends of the control winding 4a, but it may be configured such as connected to either one of the ends, or the inductance that is provided in the control winding 4a itself may be utilized, thereby eliminating the connection of the inductance. Alternatively, a capacitor may be connected to the control winding 4a in parallel, thereby establishing the step-down chopper circuit 3a under the constant-voltage control.

FIGS. 6B and 6C illustrate operations for outputting positive DC current to the control winding 4a in the step-down chopper circuit 3a, and FIG. 6C illustrates an operation for offsetting a residual magnetic flux that is generated by the DC current as shown in FIG. 6B. FIGS. 6D and 6E illustrate operations for outputting negative DC current to the control winding 4a in the step-down chopper circuit 3a, and FIG. 6E illustrates an operation for offsetting the residual magnetic flux that is generated by the DC current in FIG. 6D. In this example, the current flowing downward in the control winding 4a as illustrated, is assumed as a positive direction, and the current flowing upward is assumed as a negative direction.

In this operation example, the current direction of the control current is changed by switching the state between on and off of the switching elements Q2 and Q4 on the lower arm side of the step-down chopper circuit 3a, and pulse width control is applied to the switching elements Q1 and Q3 on the upper arm side of the step-down chopper circuit 3a, whereby a current volume of the control current is controlled. It is also possible that the current direction of the control current is changed by switching the state between on and off of the switching elements Q1 and Q3 on the upper arm side of the step-down chopper circuit 3a, and pulse width control is applied to the switching elements Q2 and Q4 on the lower arm side of the step-down chopper circuit 3a, whereby a current volume of the control current is controlled.

(Positive Direction Current)

FIG. 6B illustrates the state that positive-direction current is outputted to the control winding 4a. The control current command Icom applies pulse width control to the switching element Q1 on the upper side of the full bridge, and the switching element Q3 is turned off. On the other hand, the switching element Q2 on the lower side of the full bridge is turned off, and the switching element Q4 is turned on. According to the operation of those switching elements, the DC current Idc flows from the DC power source in the direction as indicated by the solid arrow line, and in the control winding 4a, the DC current Idc flows in the downward direction in the figure.

(Offset Operation Upon Passage of Positive Direction Current)

After the operation as shown in FIG. 6B, even though the DC current Idc is made zero, a magnetic flux remains in the core of the variable reactor, and therefore, this residual magnetic flux is cancelled by the offset operation.

In synchronization with switching AC signals of the control variable, from the positive side to the negative side, the operations of the switching elements are switched, thereby performing the offset operation for canceling the residual magnetic flux.

As shown in FIG. 6C, in the offset operation, the on/off state of the switching elements Q2 and Q4 on the lower side of the full bridge is switched to turn on the switching element Q2 and to turn off the switching element Q4, so as to reverse the direction of the DC current Idc, and the control current command Icom applies the pulse width control to the switching element Q3 on the upper side of the full bridge, thereby turning off the switching element Q1.

According to those operations of the switching elements, the current direction of the DC current Idc passing through the control winding 4a is reversed, the DC current Idc flows from the DC power source in the direction as indicated by the solid arrow line, and in the control winding 4a, the DC current Idc flows in the upward direction in the figure, thereby offsetting the residual magnetic flux.

(Negative Direction Current)

The operations for passing the DC current in the negative direction and the offset operation thereafter, correspond to the aforementioned operations where the directions of current are replaced between the positive direction current and negative direction current.

FIG. 6D illustrates that the negative direction current is outputted to the control winding 4a. The control current command Icom applies the pulse width control to the switching element Q3 on the upper side of the full bridge, thereby turning off the switching element Q1. On the other hand, the switching element Q2 on the lower side of the full bridge is turned on, and the switching element Q4 is turned off. According to this operation of the switching elements, the DC current Idc flows from the DC power source in the direction as indicated by the solid arrow line, and in the control winding 4a, the DC current Idc flows in the upward direction in the figure.

(Offset Operation Upon Passage of Negative Direction Current)

After the operation as shown in FIG. 6D, even though the DC current Idc is made zero, a magnetic flux remains in the core of the variable reactor. The direction of the residual magnetic flux generated at this time becomes opposite to the residual magnetic flux in the above case of passage of the positive direction current. The offset operation cancels this residual magnetic flux.

In synchronization with switching AC signals of the control variable, from the negative side to the positive side, the operations of the switching elements are switched, whereby the offset operation for canceling the residual magnetic flux is performed.

As shown in FIG. 6E, in the offset operation, the switching elements Q2 and Q4 on the lower side of the full bridge are switched between on and off, and the switching element Q2 is turned off, and the switching element Q4 is turned on, thereby reversing the direction of the DC current Idc, and the control current command Icom applies the pulse width control to the switching element Q1 on the upper side of the full bridge, thereby turning off the switching element Q3.

According to this operation of the switching elements, the current direction of the DC current Idc passing through the control winding 4a is reversed, the DC current Idc flows from the DC power source in the direction as indicated by the solid arrow line in the figure, and in the control winding 4a, the DC current Idc flows in the upward direction in the figure, thereby offsetting the residual magnetic flux.

Figure 7A:
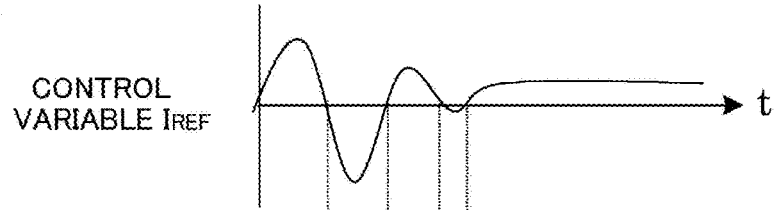
FIGS. 7A through 7C each illustrates a configuration and operation of the chopper circuit in the control current generator of the present invention.
Figure 7B:
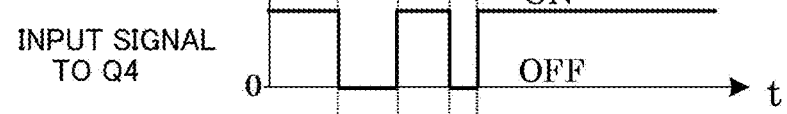
Figure 7C:
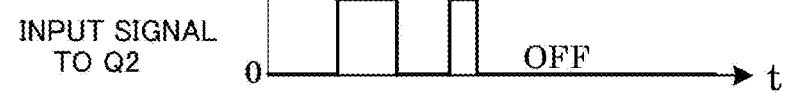

FIGS. 7A through 7C each illustrates a relationship between input signals to the switching elements Q2 and Q4, and positive and negative properties of the control variable. FIG. 7A illustrates one example of the control variable IREF, FIG. 7B shows an input signal in the switching element Q4, and FIG. 7C illustrates an input signal in the switching element Q2.

When the control variable IREF is positive, the input signal in the switching element Q4 is turned on, and the input signal in the switching element Q2 is turned off. With those input signals, current in the positive direction with respect to the control winding is outputted.

On the other hand, when the control variable IREF is negative, the input signal in the switching element Q4 is turned off, and the input signal in the switching element Q2 is turned on. With those input signals, the negative direction current is outputted to the control winding.

In the current above, the control current outputted after the positive and negative properties of the control variable IREF are reversed, operates as current that cancels the residual magnetic flux generated by the control current before reversal.

Next, a short circuit in the step-down chopper circuit will be described. In the operation of the switching elements in the step-down chopper circuit 3a, in the case where jitter, or the like, occurs in the input signal to the switching elements, upon switching the current directions of the control current, there is a possibility that both switching elements are turned on; the switching elements Q1 and Q2, and the switching element Q3 and the switching element Q4, connected in series with the DC power source, resulting in that a short-circuit may occur between the switching elements connected in series, and it is anticipated that this may cause element destruction.

In order to avoid such short-circuit between the switching elements, there is provided a dead band where all the switching elements are turned off within the range including zero at which the control variable IREF is switched between positive and negative.

FIG. 8 illustrates an example that there is provided the dead band of the control current Idc is set to 0 A in the range where the control variable IREF is between −1 A and 0 A.

By providing this dead band, it is possible to avoid the switching element Q1 is turned on simultaneously with turning on the switching element Q2, and also to avoid that the switching element Q3 is turned on simultaneously turning on the switching element Q4. It is to be noted that the place where the dead band is provided is not limited to the range as shown in FIG. 8, but it may be set in a predetermined width including a point where the control variable IREF becomes zero.

(Measurement Example by Impedance Matching Device of the Present Invention)

Next, a measurement example according to the impedance matching device of the present invention will be described.

Response Time of Inductance Variation

FIG. 9 illustrates a comparison of measurement examples of response time in the inductance variation. In this example here, Example 1 indicates altered responsiveness of an inductance value when the control current was changed from 0 A to −10 A step by step, with respect to the control winding where the number of turns was 16, and Example 2 indicates the altered responsiveness of an inductance value when the control current was stepwise changed from 0 A to −20 A, with respect to the control winding where the number of turns was 32.

As expressed by the formula 6, the generated magnetic field H is proportional to a product of the magnitude I of control current and the number of turns N of control winding, and therefore, the generated magnetic field of Example 2 is four times larger relative to the generated magnetic field of Example 1.

FIG. 9 shows a comparison between the inductance variation according to Example 1 and the inductance variation according to Example 2, in the case where the initial inductance was changed from 500 [nH] to 342 [nH]. According to this comparison, it was 18 msec until the inductance reached 342 [nH] by the generated magnetic field of Example 1, whereas it was 3 msec until the inductance reached 342 [nH] by the generated magnetic field of Example 2, indicating that the response time was reduced to one-sixth of the time.

Controlled Response of Progressive Wave Power and Reflected Wave Power

FIGS. 10A and 10B each illustrates measurement examples of a controlled response of the progressive wave power and reflected wave power in the impedance matching device, when the load changed suddenly. In this example, as measurement conditions, assuming that;

LOAD A: 1.9+j24 [Ω]
LOAD B: 3.0+j30 [Ω]
comparison was made as to the following examples;
Measurement example 1 (FIG. 10A):
Control current range: 0 to +10 A, Number of turns: 16
Measurement example 2 (FIG. 10B):
Control current range: 0 to ±20 A, Number of turns: 32.

The generated magnetic field of Measurement example 2 was four times larger than the generated magnetic field of Measurement example 1, on the positive side.

In the measurement example 1 as shown in FIG. 10A, it took 12 ms until the reflected wave power converged, whereas in the measurement example 2 as shown in FIG.

10B, the reflected wave power converged in 1 ms. Therefore, this indicates that by enlarging the generated magnetic field, the response time required for inductance variation in the variable reactor was reduced, thereby achieving high-speed impedance matching.

(Configuration Example of Variable Reactor of the Present Invention)

With reference to FIGS. 11A through 11C and 12A through 12C, there will be described a configuration example for removing high-frequency components generated by the variable reactor which is used in the impedance matching device of the present invention.

Figure 11A:
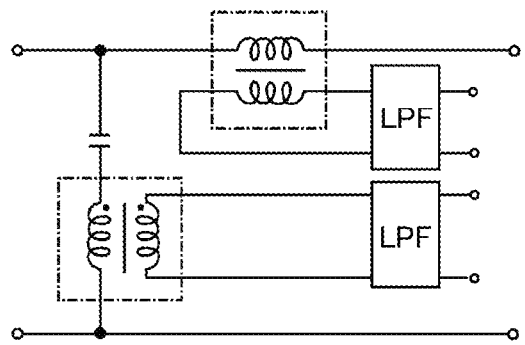
FIGS. 11A through 11C each illustrates configurations of a variable reactor in the impedance matching device of the present invention.
Figure 11B:
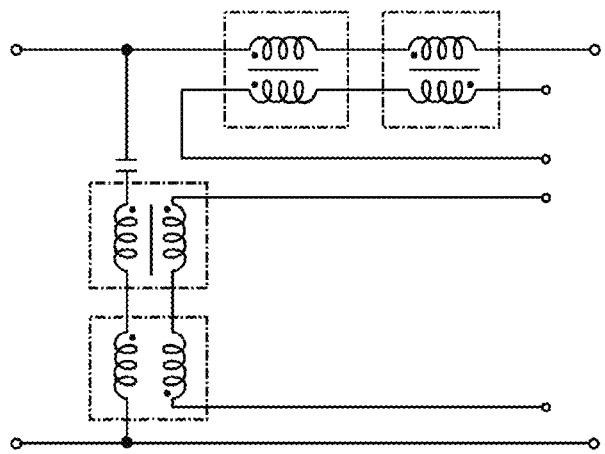
Figure 11C:
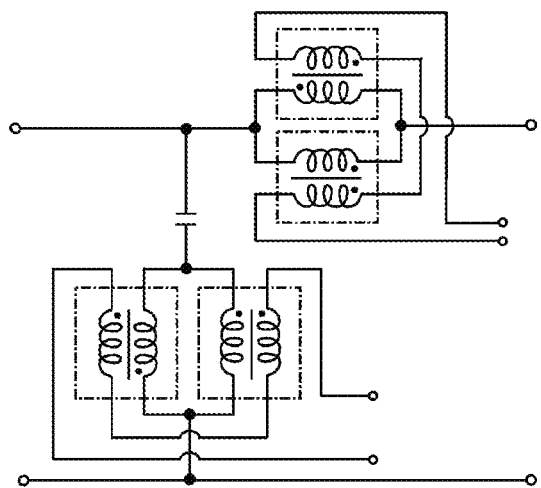

The variable reactor as shown in FIG. 11A has a configuration that is provided with a low pass filter for removing high-frequency components induced on the control current generator side of the variable reactor. The variable reactor as shown in FIG. 11B has a configuration of a pair of variable reactors connected in series where the main winding and the control winding are wound in the directions reverse to each other for offsetting high-frequency components, so as to remove the high-frequency components induced to the control current generator side of the variable reactor. The variable as shown in reactor FIG. 11C has a configuration of a pair of variable reactors connected in parallel, for offsetting the high-frequency components.

Figure 12A:
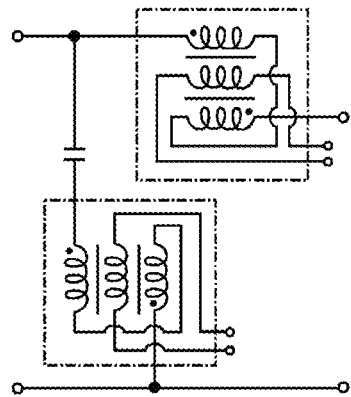
FIGS. 12A through 12C each illustrates configurations of the variable reactor in the impedance matching device of the present invention.
Figure 12B:
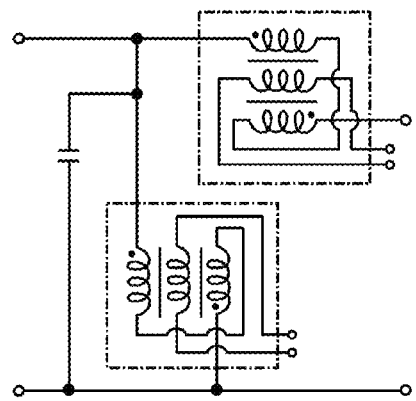
Figure 12C:
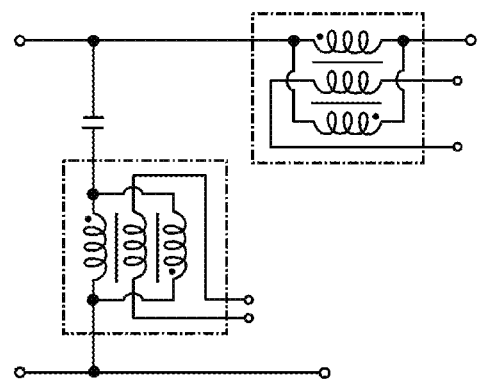
Figure 13A:
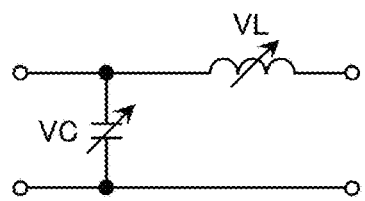
FIGS. 13A through 13I each illustrates arrangements of the variable reactor of the present invention.
Figure 13B:
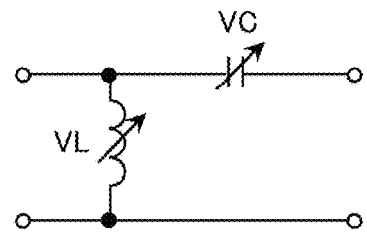
Figure 13C:
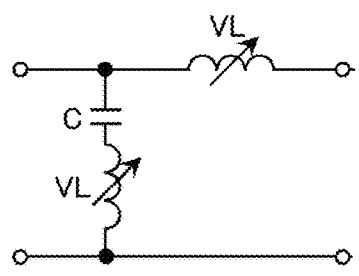
Figure 13D:
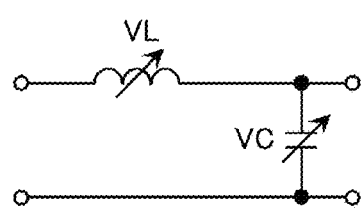
Figure 13E:
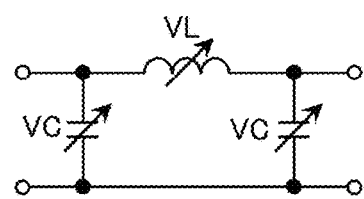
Figure 13F:
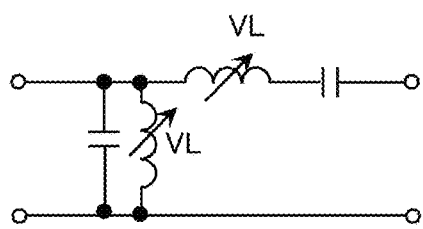
Figure 13G:
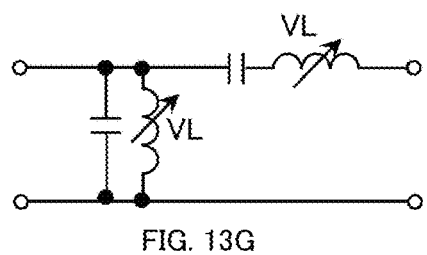
Figure 13H:
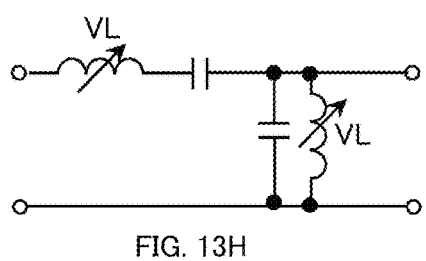
Figure 13I:
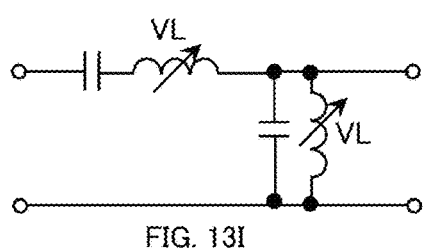

Each of the variable reactors as shown in FIGS. 12A to 12C has two toroidal cores, the main winding is wound around each toroidal core, the control winding for both toroidal cores is wound in such a manner as passing through each one turn of the main windings, and two main windings are connected equivalently in series, establishing a configuration that high-frequency components induced in the control winding according to passage of RF current in each main winding are removed, being canceled in every one turn of the control winding.

FIG. 1 and FIGS. 11A through 11C and 12A through 12C illustrate a configuration example where the variable reactors connected in series-parallel. In the configurations of the impedance matching device as shown in FIGS. 13A to 13I, the variable reactor of the present invention can be applied to variable inductance.

Descriptions in the aforementioned embodiments and modification examples represent a part of the examples of the impedance matching device according to the present invention. Therefore, it is to be understood that the present invention is not limited to each of those embodiments, but it may be variously modified on the basis of the spirit of the present invention, and such modifications are not excluded from the scope of the invention.

INDUSTRIAL APPLICABILITY

The impedance matching device of the present invention may be applicable to impedance matching, in manufacturing equipment for producing a semiconductor, a liquid crystal panel, and the like, vacuum deposition equipment, and equipment using high frequencies, such as a heating and melting unit.

DESCRIPTION OF SYMBOLS 1 control current foaming part
2 operation part
2A operation part
2B operation part
2*a* first arithmetic circuit
2*b* second arithmetic circuit
2*c* adder circuit
2*d* AC signal generating circuit
3 control current generator
3A control current generator
3B control current generator
3*a* step-down chopper circuit
3*b* comparison circuit
3*c* triangle-wave signal generation circuit
3*d* comparison circuit
4 variable reactor
4A variable reactor
4B variable reactor
4*a* control winding
5 sensor
10 impedance matching device
20 RF power source
30 load
101 impedance control circuit
102 variable reactor
102A variable reactor
102B variable reactor
102*a* control winding
102*b* main winding
102*b*1 main winding
102*b*2 main winding
102*c* ferrite core
B magnetic flux density
B0 magnetic flux density
B1 residual magnetic flux
H generated magnetic field
Icom control current command
Icon control current
Idc control current
$IREF_\infty$ control settled value
IREF control variable
IZREF inductance control target value
IφREF control variable
L inductance
$L_0$ inductance
$L_1$ inductance
N number of turns
Q1-Q4 switching element
ZFB impedance feedback value
ZREF impedance control target value
φFB phase feedback value
φREF phase control target value

What is claimed is:

1. An impedance matching device for matching RF supply side impedance to load side impedance, comprising:
a variable reactor having a main winding and a control winding, being wound around a core, and rendering inductance to be variable according to a variation of a generated magnetic field that is generated by control current passing through the control winding, and
a control current forming part configured to form control current to be applied to the control winding, wherein,
the generated magnetic field is an AC magnetic field having a magnitude exceeding a magnetic field that is required for controlling a deviation between a control target value and a feedback value for impedance matching,
the control current forming part comprises:
an operation part configured to compute a deviation signal that converges to a control settled value for controlling a deviation component between the control target value and the feedback value for impedance matching, and a control current generator configured to generate the control current having a current direction determined on the basis of positive and negative properties of an AC signal being a control variable of the operation part, and current amplitude determined on the basis of an amplitude amplification of the AC signal, wherein, impedance matching is performed by inductance variation in the variable reactor according to the control current, the operation part configures a double loop control, comprising:
- a first arithmetic circuit constituting a major loop on the basis of a difference between the control target value for impedance matching and the feedback value for impedance matching, and computing the control variable according to the major loop, and
- a second arithmetic circuit constituting a minor loop on the basis of a difference between the control variable of the first arithmetic circuit and a feedback value of the control current, and computing amplitude of the control variable by the minor loop, so as to obtain a control current command, and the control current generator switches current directions of the control current on the basis of positive and negative properties of the control variable, and generates the control current whose amplitude is determined on the basis of the control current command.

2. The impedance matching device according to claim 1, wherein, the first arithmetic circuit comprises either of the following control circuits:
- a proportional integral control circuit configured to output as the control variable, a proportional integral signal obtained by performing proportional integral control over a difference between the control target value and the feedback value for impedance matching, and
- an integral control circuit configured to output as the control variable, an integral signal obtained by performing integral control over the difference between the control target value and the feedback value for impedance matching, and the second arithmetic circuit comprises either one of the following control circuits:
- a proportional integral control circuit configured to output as the control current command, a proportional integral signal obtained by performing proportional integral control over a difference between the control variable of the first arithmetic circuit and the feedback value of the control current, and
- an integral control circuit configured to output as the control current command, an integral signal obtained by performing integral control over the difference between the control variable of the first arithmetic circuit and the feedback value of the control current.

3. The impedance matching device according to claim 2, wherein, the AC signal having an amplitude that asymptotically approaches the control current command after controlling is performed.

4. The impedance matching device according to claim 3, wherein, the control current generator comprises a chopper circuit of full-bridge configuration including four switching elements, wherein, in controlling the amplitude of the control current that is applied to the control winding, the pulse width control is applied to open-close operations of either one of two switching elements, connected to control current signals, on the basis of the amplitude of the control current command, and switching of the directions of the control current applied to the control winding is controlled by the switching operation on the basis of the polarity of the control variable of the two switching elements that are connected to the control current signals.

5. The impedance matching device according to claim 2, wherein, the control current generator comprises a chopper circuit of full-bridge configuration including four switching elements, wherein, in controlling the amplitude of the control current that is applied to the control winding, the pulse width control is applied to open-close operations of either one of two switching elements, connected to control current signals, on the basis of the amplitude of the control current command, and switching of the directions of the control current applied to the control winding is controlled by the switching operation on the basis of the polarity of the control variable of the two switching elements that are connected to the control current signals.

6. The impedance matching device according to claim 1, wherein, the control current generator comprises a chopper circuit of full-bridge configuration including four switching elements, wherein, in controlling the amplitude of the control current that is applied to the control winding, the pulse width control is applied to open-close operations of either one of two switching elements, connected to control current signals, on the basis of the amplitude of the control current command, and switching of the directions of the control current applied to the control winding is controlled by the switching operation on the basis of the polarity of the control variable of the two switching elements that are connected to the control current signals.

7. The impedance matching device according to claim 1, wherein, the magnitude of the generated magnetic field is determined by a product of the number of turns of the control winding, and a current value of the control current.

* * * * *